United States Patent
Liu et al.

(10) Patent No.: US 10,734,394 B2
(45) Date of Patent: Aug. 4, 2020

(54) CELL BOUNDARY STRUCTURE FOR EMBEDDED MEMORY

(71) Applicant: Taiwan Semiconductor Manufacturing Co., Ltd., Hsin-Chu (TW)

(72) Inventors: Ming Chyi Liu, Hsinchu (TW); Shih-Chang Liu, Alian Township (TW); Sheng-Chieh Chen, Taichung (TW); Yu-Hsing Chang, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/732,402

(22) Filed: Jan. 2, 2020

(65) Prior Publication Data
US 2020/0144276 A1    May 7, 2020

Related U.S. Application Data

(60) Continuation of application No. 16/506,207, filed on Jul. 9, 2019, now Pat. No. 10,535,671, which is a
(Continued)

(51) Int. Cl.
*H01L 27/11521* (2017.01)
*H01L 27/11526* (2017.01)
(Continued)

(52) U.S. Cl.
CPC ...... *H01L 27/11521* (2013.01); *H01L 21/762* (2013.01); *H01L 27/11526* (2013.01);
(Continued)

(58) Field of Classification Search
CPC ......... H01L 27/11521; H01L 29/42328; H01L 27/11526; H01L 21/762; H01L 23/528;
(Continued)

(56) References Cited

U.S. PATENT DOCUMENTS

| 8,551,843 | B1 | 10/2013 | Cai et al. |
| 9,159,843 | B2 | 10/2015 | Saito et al. |

(Continued)

OTHER PUBLICATIONS

Notice of Allowance dated Jul. 17, 2018 for U.S. Appl. No. 15/694,098.
(Continued)

*Primary Examiner* — Selim U Ahmed
(74) *Attorney, Agent, or Firm* — Eschweiler & Potashnik, LLC

(57) ABSTRACT

Various embodiments of the present application are directed to a method for forming an embedded memory boundary structure with a boundary sidewall spacer. In some embodiments, an isolation structure is formed in a semiconductor substrate to separate a memory region from a logic region. A multilayer film is formed covering the semiconductor substrate. A memory structure is formed on the memory region from the multilayer film. An etch is performed into the multilayer film to remove the multilayer film from the logic region, such that the multilayer film at least partially defines a dummy sidewall on the isolation structure. A spacer layer is formed covering the memory structure, the isolation structure, and the logic region, and further lining the dummy sidewall. An etch is performed into the spacer layer to form a spacer on dummy sidewall from the spacer layer. A logic device structure is formed on the logic region.

20 Claims, 21 Drawing Sheets

Related U.S. Application Data continuation of application No. 16/167,879, filed on Oct. 23, 2018, now Pat. No. 10,461,089, which is a division of application No. 15/694,098, filed on Sep. 1, 2017, now Pat. No. 10,134,748.

(60) Provisional application No. 62/427,337, filed on Nov. 29, 2016.

(51) Int. Cl.
| | |
|---|---|
| *H01L 21/28* | (2006.01) |
| *H01L 27/11534* | (2017.01) |
| *H01L 21/762* | (2006.01) |
| *H01L 29/423* | (2006.01) |
| *H01L 27/11548* | (2017.01) |
| *H01L 23/528* | (2006.01) |

(52) U.S. Cl.
CPC .. *H01L 27/11534* (2013.01); *H01L 27/11548* (2013.01); *H01L 29/40114* (2019.08); *H01L 29/42328* (2013.01); *H01L 23/528* (2013.01)

(58) Field of Classification Search
CPC ......... H01L 27/11548; H01L 27/11534; H01L 29/40114
See application file for complete search history.

(56) References Cited

U.S. PATENT DOCUMENTS

| | | |
|---|---|---|
| 9,659,953 B2 | 5/2017 | Chuang et al. |
| 2009/0111226 A1 | 4/2009 | Chindalore |
| 2012/0299084 A1 | 11/2012 | Saito et al. |
| 2013/0102138 A1 | 4/2013 | Yeh et al. |
| 2014/0286105 A1 | 9/2014 | Lin et al. |
| 2015/0041875 A1 | 2/2015 | Perera |
| 2015/0333082 A1 | 11/2015 | Chuang et al. |
| 2016/0056250 A1 | 2/2016 | Chuang et al. |
| 2016/0181268 A1 | 6/2016 | Chuang et al. |
| 2016/0307909 A1* | 10/2016 | Tseng .................. H01L 27/1157 |

OTHER PUBLICATIONS

Notice of Allowance dated Jun. 14, 2019 for U.S. Appl. No. 16/167,879.

Non-Final Office Action dated Oct. 3, 2019 for U.S. Appl. No. 16/506,207.

Notice of Allowance dated Nov. 18, 2019 for U.S. Appl. No. 16/506,207.

\* cited by examiner

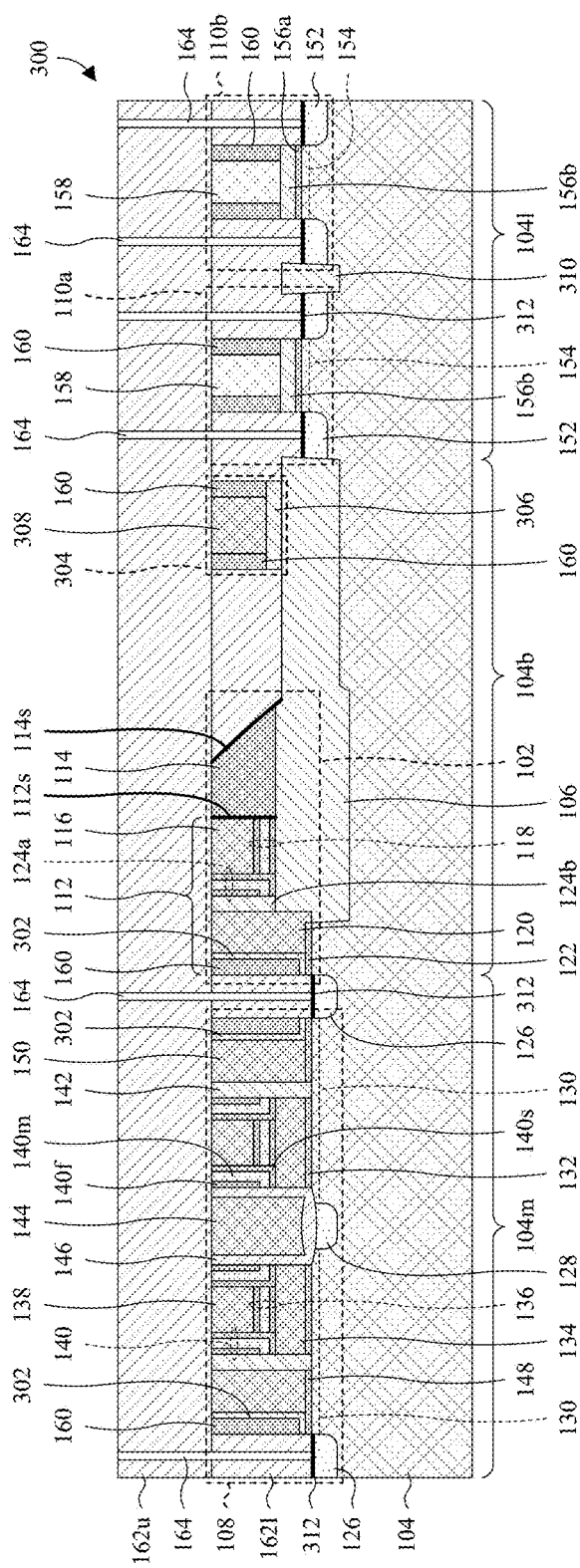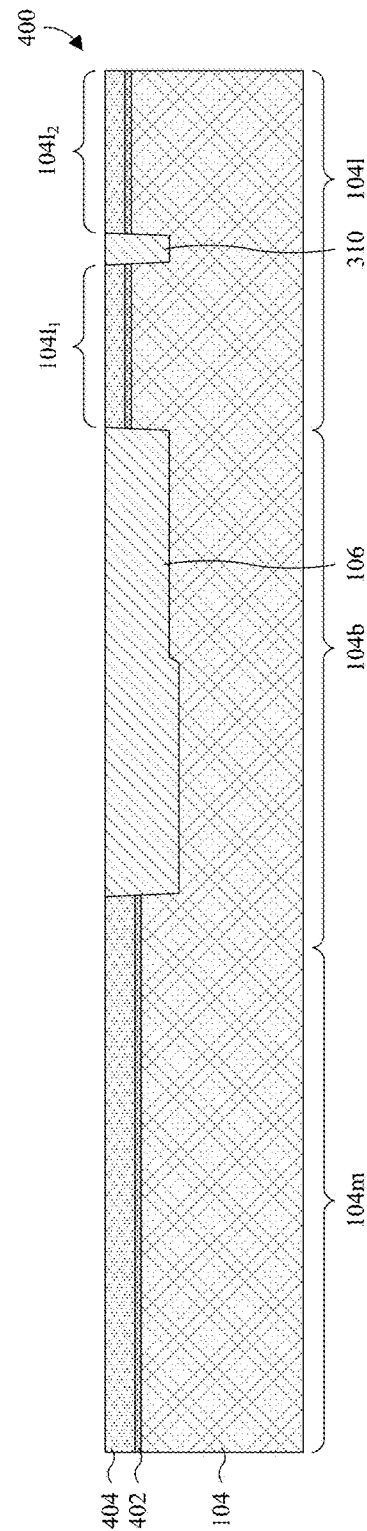
Fig. 3
Fig. 4

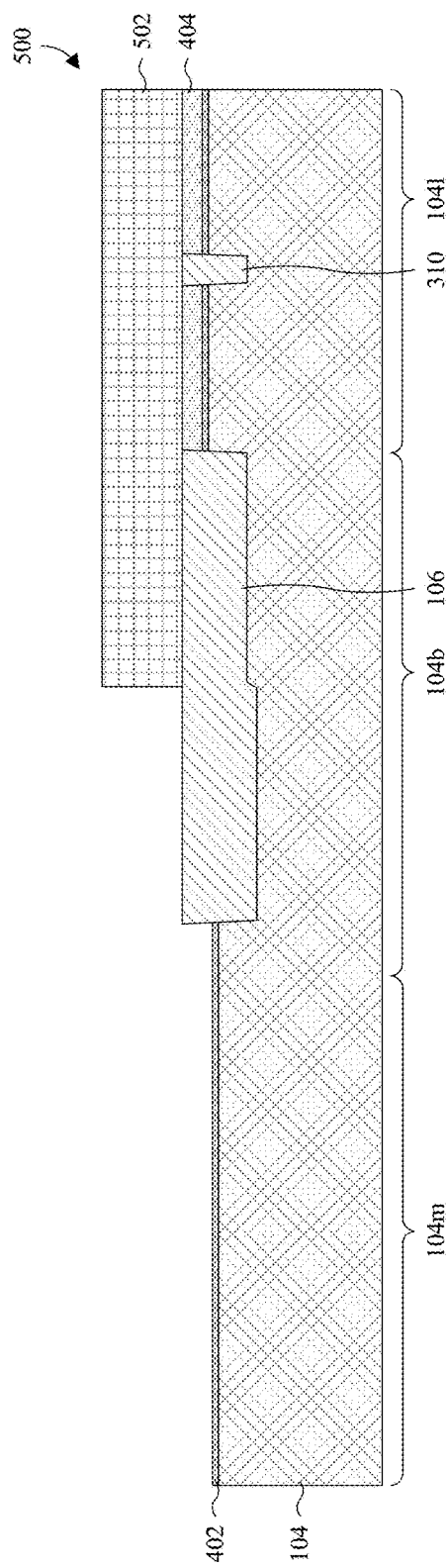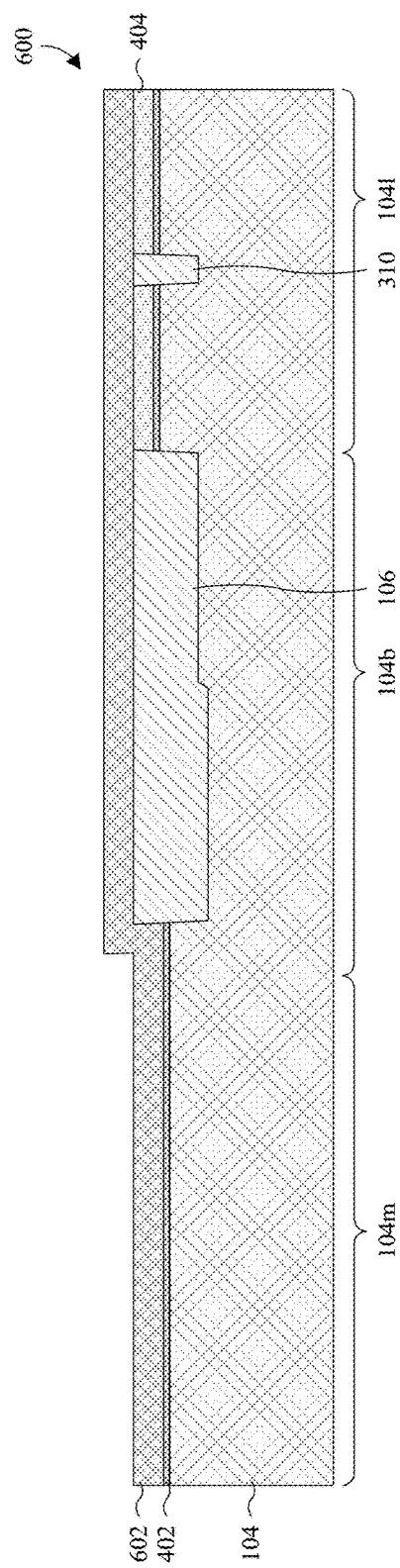
Fig. 5
Fig. 6

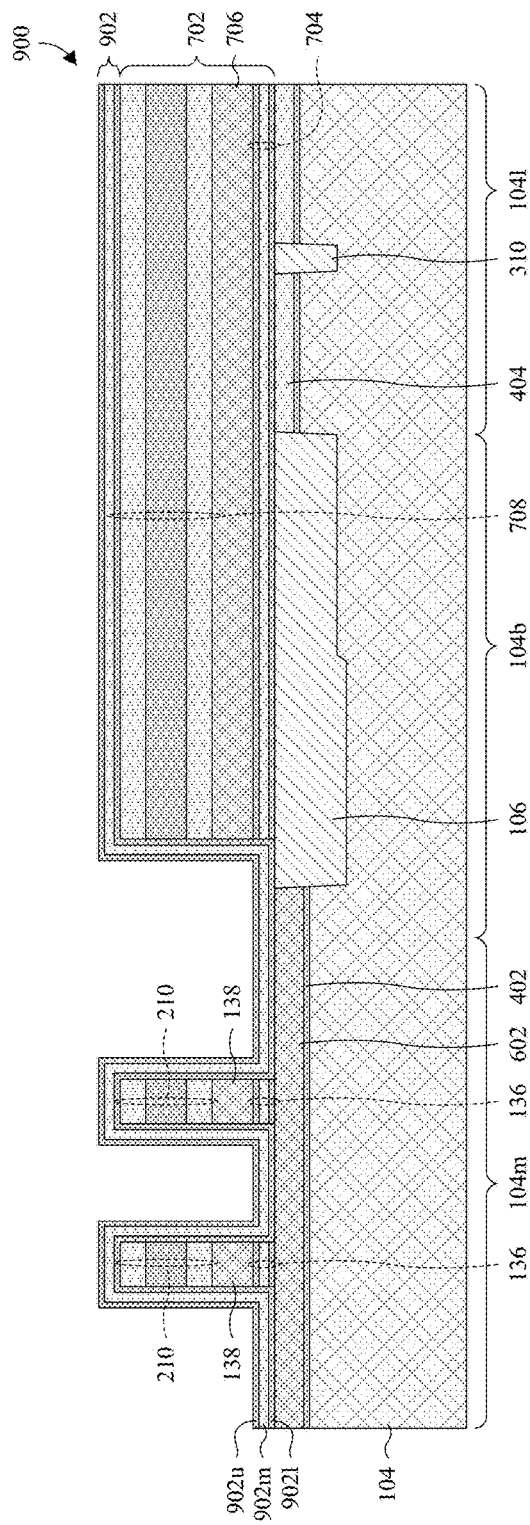
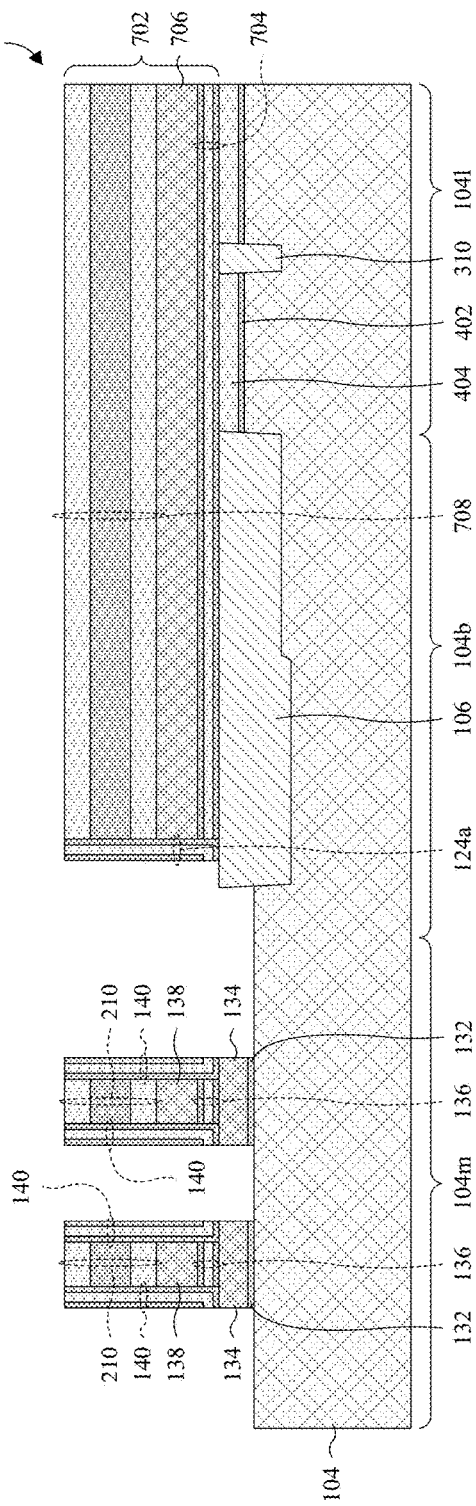
Fig. 9
Fig. 10

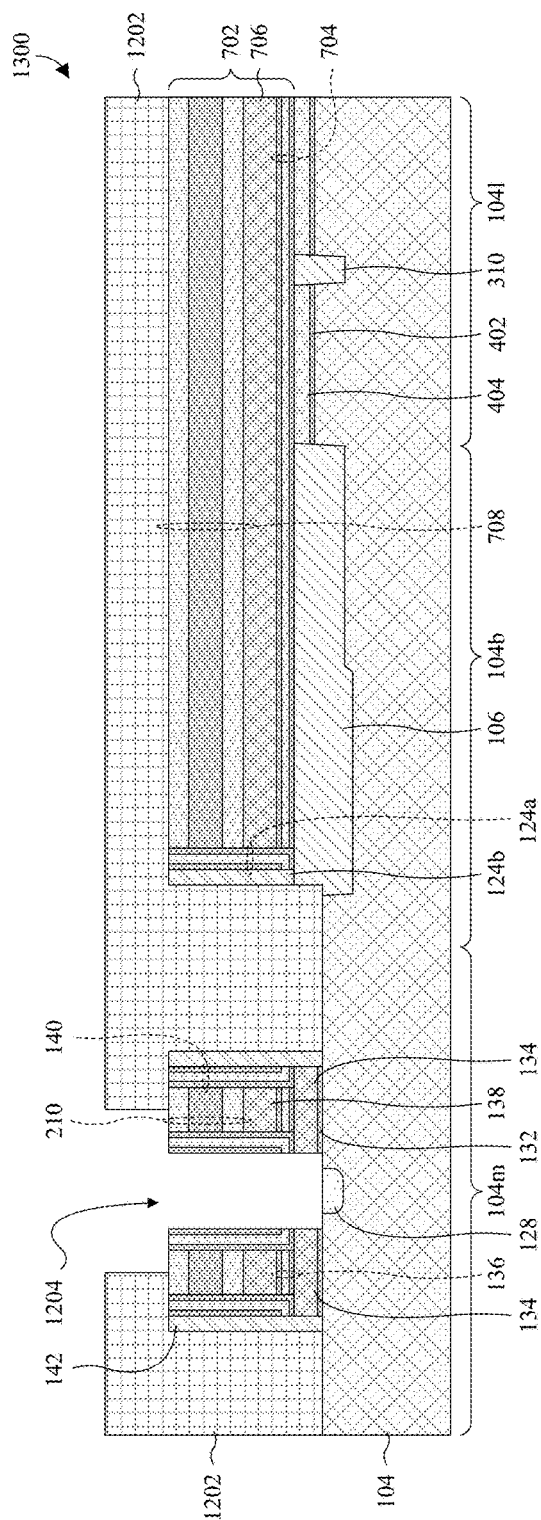
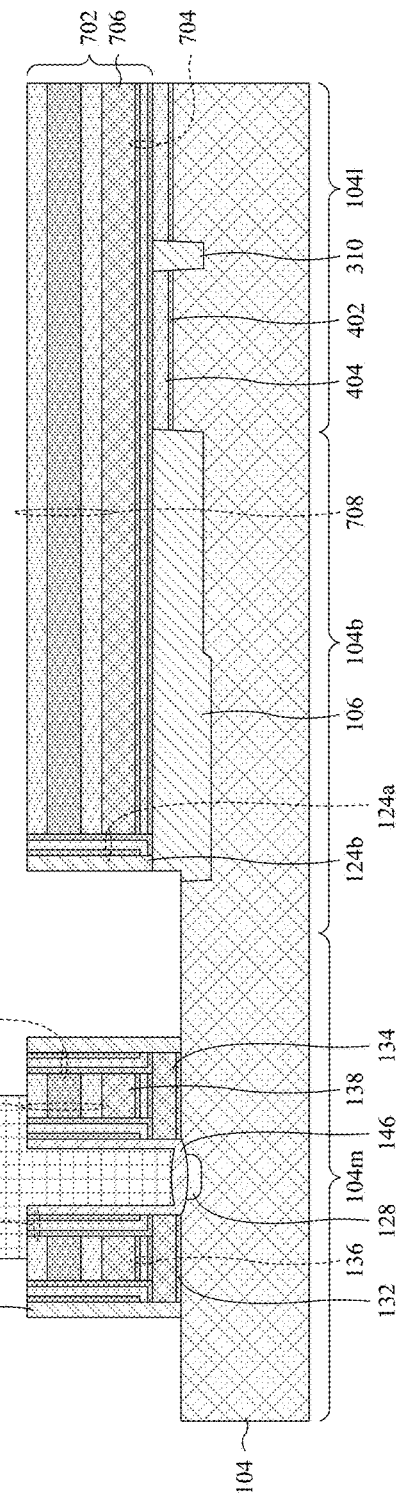

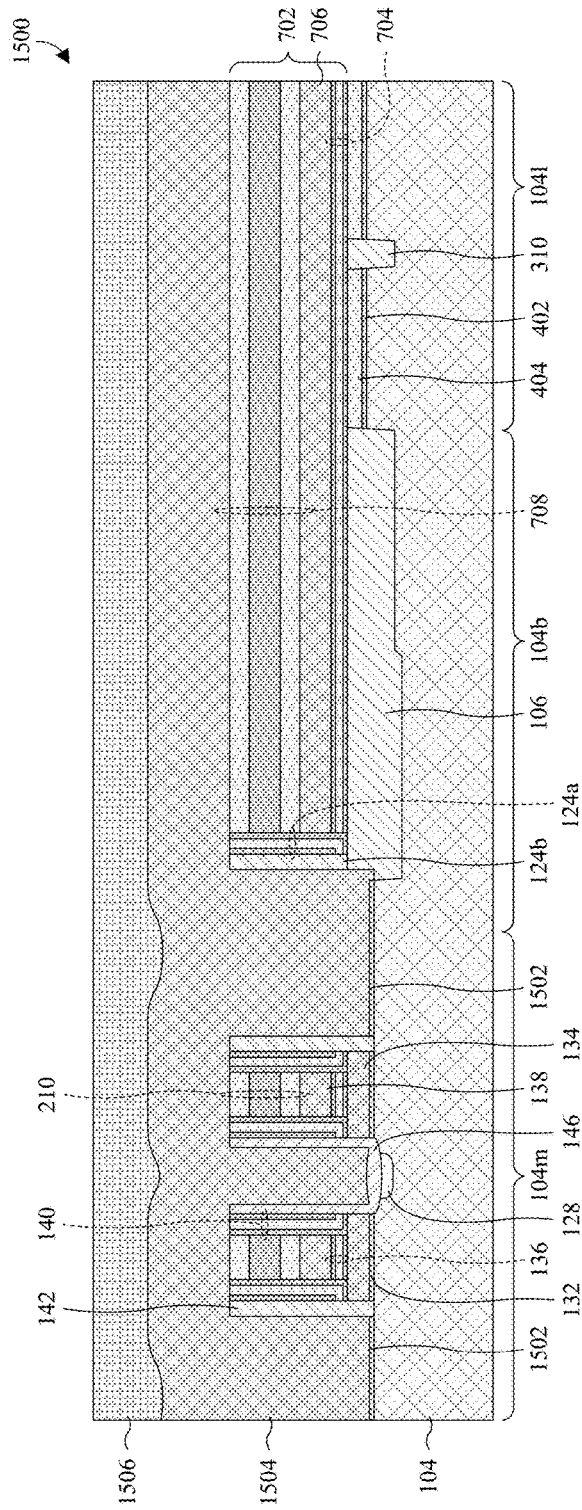
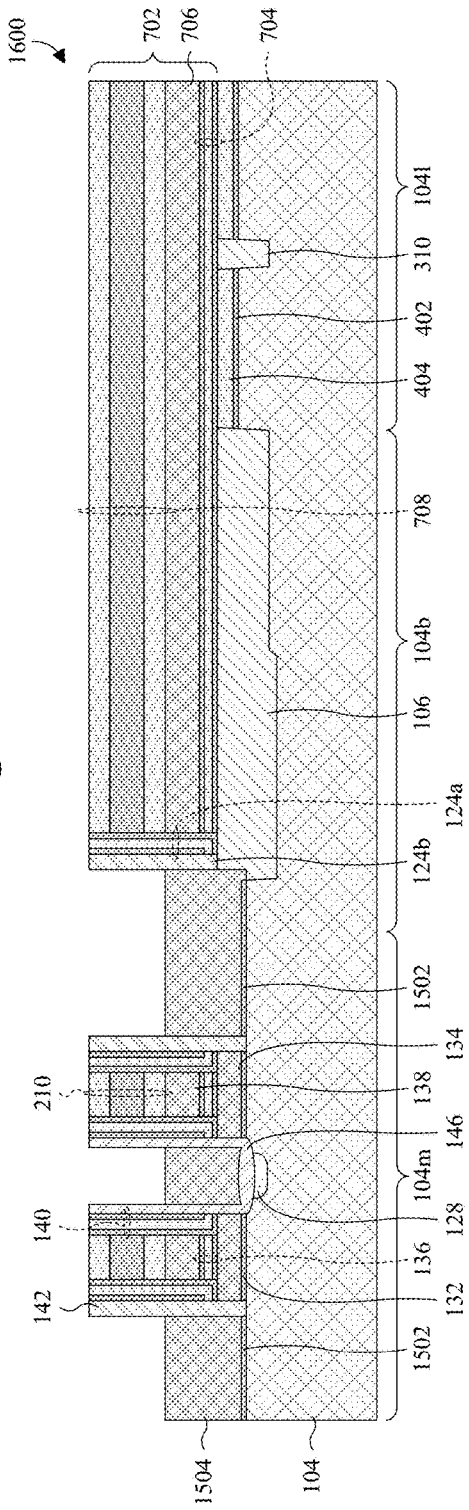
Fig. 15
Fig. 16

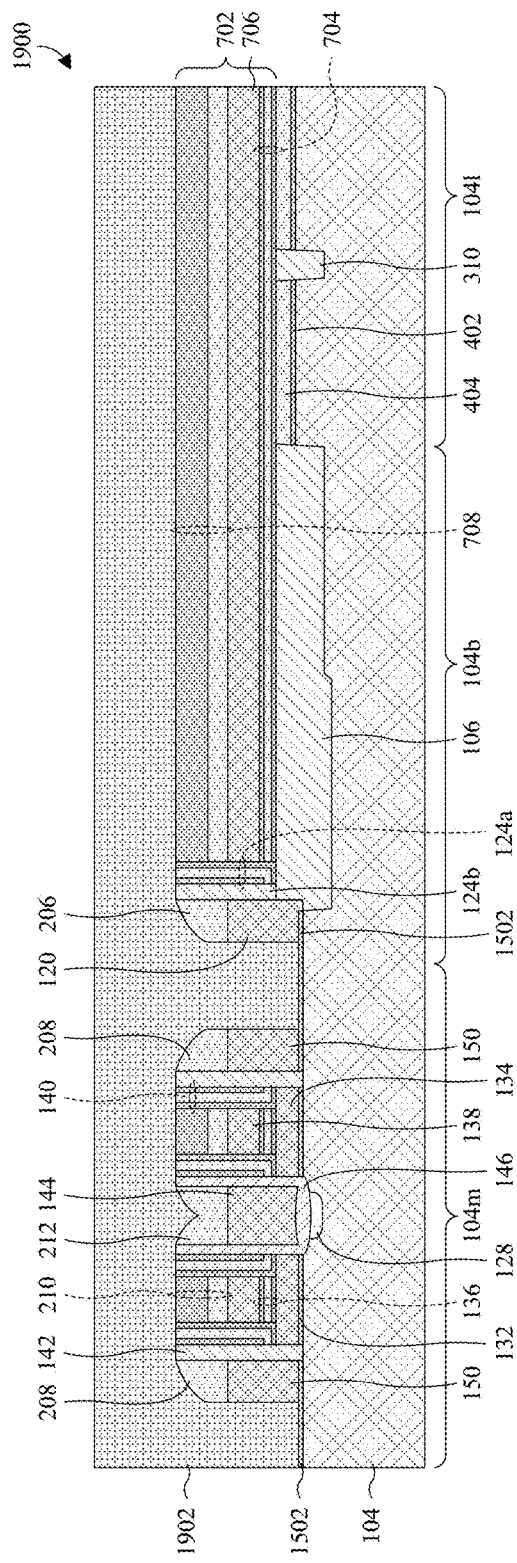
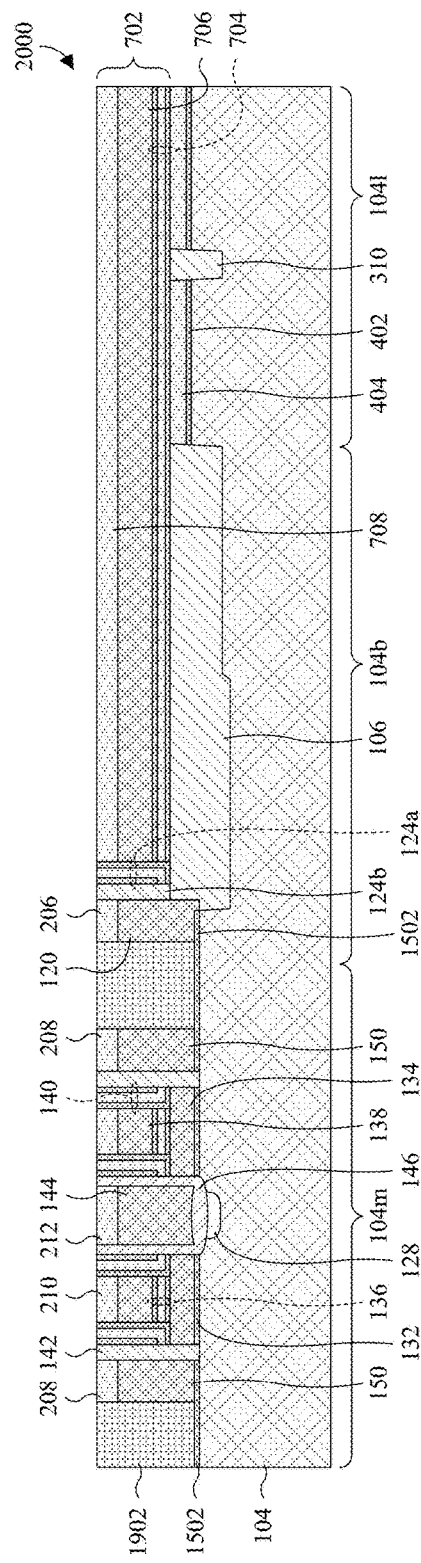
Fig. 19
Fig. 20

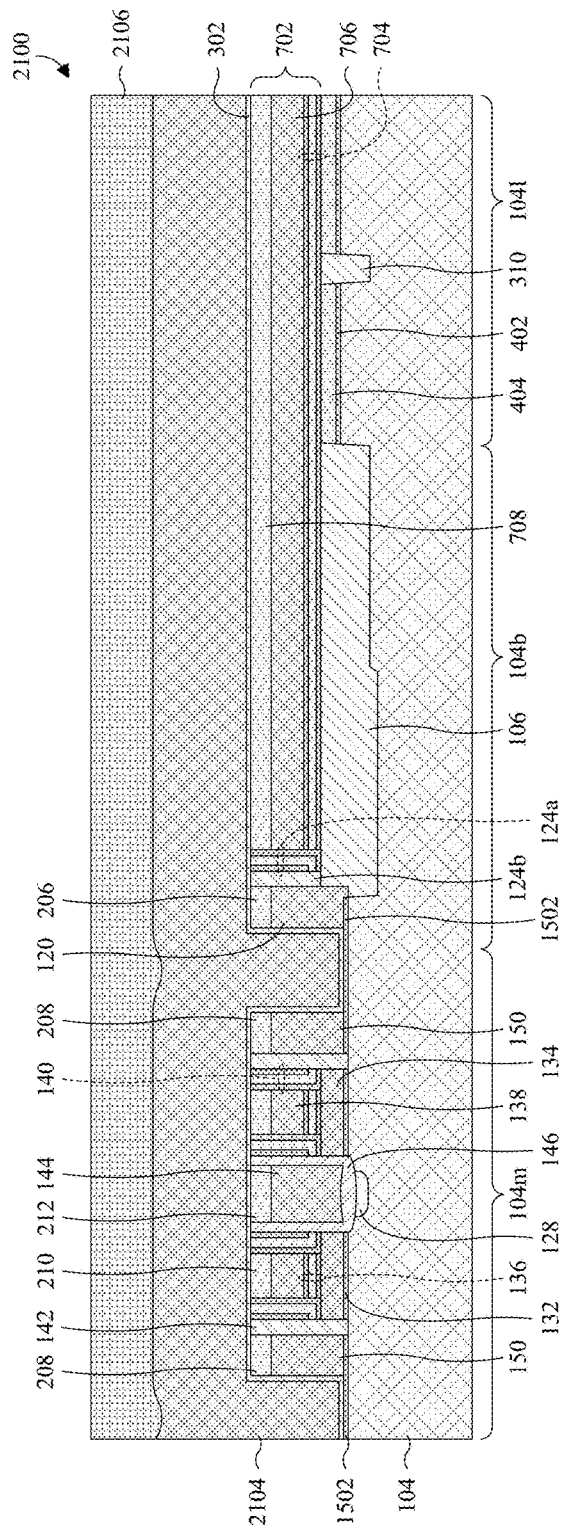
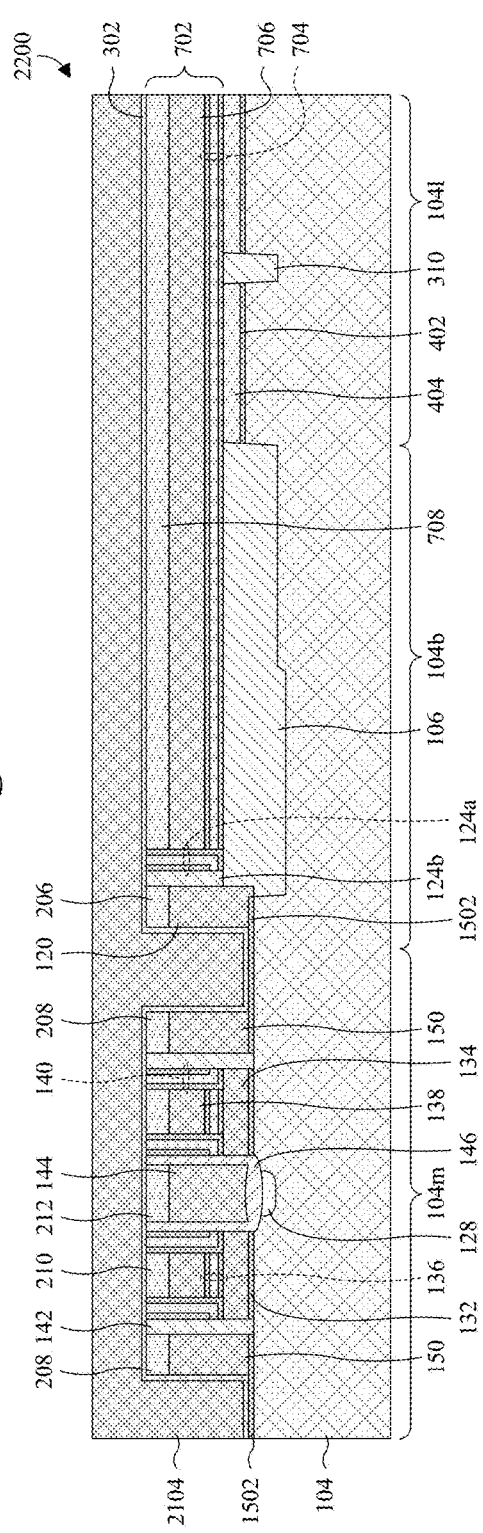
Fig. 21
Fig. 22

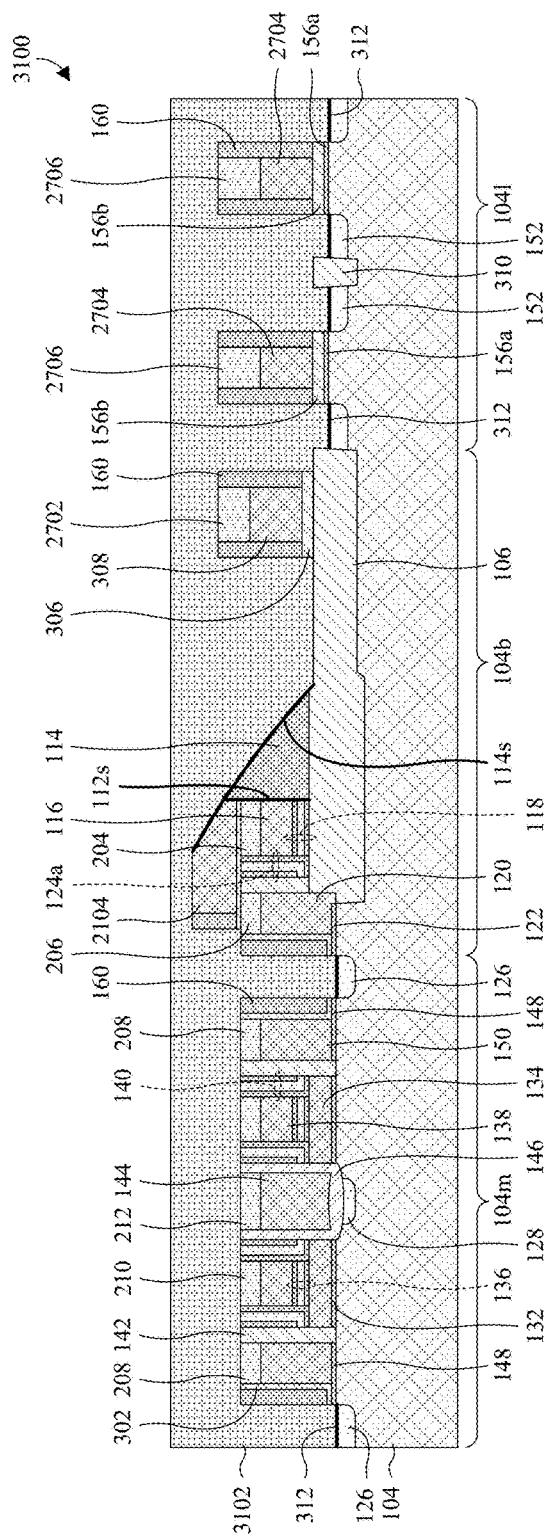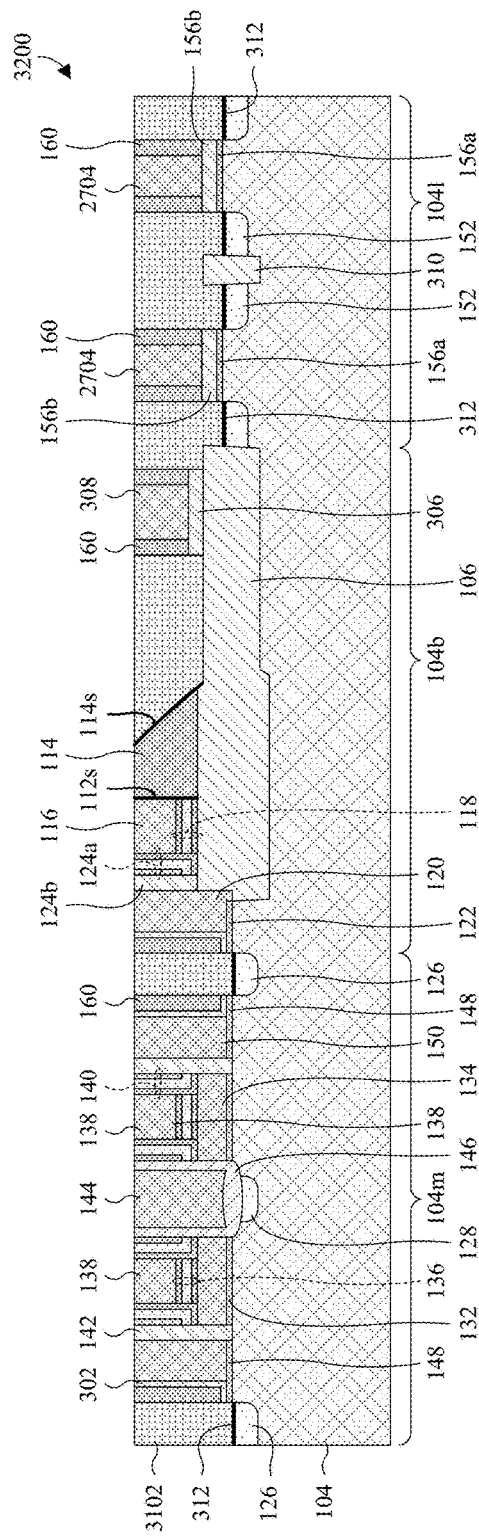

CELL BOUNDARY STRUCTURE FOR EMBEDDED MEMORY

REFERENCE TO RELATED APPLICATIONS

This Application is a Continuation of U.S. application Ser. No. 16/506,207, filed on Jul. 9, 2019, which is a Continuation of U.S. application Ser. No. 16/167,879, filed on Oct. 23, 2018 (now U.S. Pat. No. 10,461,089, issued on Oct. 29, 2019), which is a Divisional of U.S. application Ser. No. 15/694,098, filed on Sep. 1, 2017 (now U.S. Pat. No. 10,134,748, issued on Nov. 20, 2018), which claims the benefit of U.S. Provisional Application No. 62/427,337, filed on Nov. 29, 2016. The contents of the above-referenced Patent Applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component (or line) that can be created) has decreased. Some advancements in the evolution of ICs include embedded memory technology and high κ metal gate (HKMG) technology. Embedded memory technology is the integration of memory devices with logic devices on the same semiconductor chip, such that the memory devices support operation of the logic devices. High κ metal gate (HKMG) technology is the manufacture of semiconductor devices using metal gate electrodes and high-K gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a cross-sectional view of some more detailed embodiments of the IC of FIG. 1.

FIGS. 4-37 illustrate a series of cross-sectional views of some embodiments of a method for forming an IC comprising an embedded memory boundary structure with a boundary sidewall spacer.

DETAILED DESCRIPTION

Figure 1A:
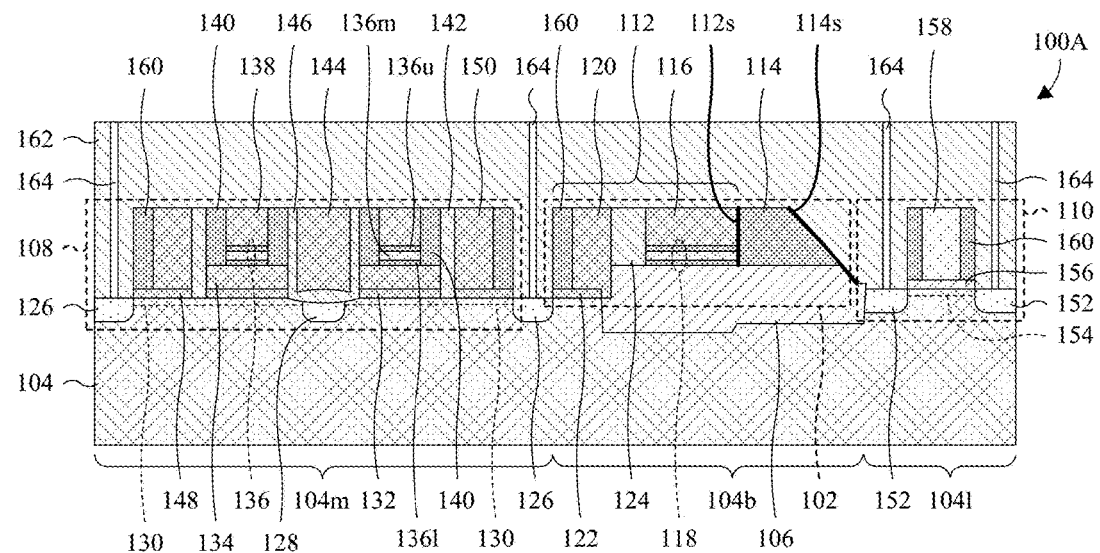
FIGS. 1A and 1B illustrate various cross-sectional views of some embodiments of an integrated circuit (IC) comprising an embedded memory boundary structure with a boundary sidewall spacer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to some methods for manufacturing an integrated circuit (IC) with embedded memory technology and high κ metal gate (HKMG) technology, a pad nitride layer is formed and patterned on a semiconductor substrate. A first etch is performed into the semiconductor substrate using the pad nitride layer as a mask to form a trench separating a memory region of the semiconductor substrate from a logic region of the semiconductor substrate. The trench is filled with a dielectric material to form a boundary isolation structure, and a multilayer film is formed covering the memory and logic regions and the boundary isolation structure. Memory devices are formed on the memory region from the multilayer film, and a dummy polysilicon (DPO) layer is formed covering the memory devices and a remainder of the multilayer film. A second etch is performed into the multilayer film and the DPO layer to remove the multilayer film and the DPO layer from the logic region, such that a remainder of the multilayer film and a remainder of the DPO layer collectively define a boundary sidewall that is smooth and that faces the logic region on the boundary isolation structure. A third etch is performed into the pad nitride layer to remove the pad nitride layer from the logic region, and logic devices are formed on the logic region using high κ gate dielectric layers and polysilicon gate electrodes. Subsequently, a HKMG replacement process is performed to replace the polysilicon gate electrodes with metal gate electrodes.

A challenge with the methods is that the third etch may damage the boundary sidewall so it is no longer smooth. For example, the third etch may lead to lateral undercutting, divots, and the like in the boundary sidewall since the boundary sidewall is defined by multiple layers and one or more of the multiple layers may comprise the same material as the pad nitride layer, which is removed during the third etch. Damaging the boundary sidewall may lead to fill issues, conductivity issues, device performance shifts, and/or other reliability issues during subsequent processing. For example, during formation of the logic devices, a high κ dielectric layer and a polysilicon layer may be formed lining the logic region and the boundary sidewall. The high κ dielectric layer and the polysilicon layer may then be patterned into the logic devices. Because the boundary sidewall is damaged during the third etch, high κ residue may remain on the boundary sidewall (e.g., within the divots or lateral undercuts) after patterning the high κ dielectric layer. The high κ residue may, in turn, diffuse into the semiconductor substrate, thereby shifting doping profiles in the semiconductor substrate and changing parameters of devices (e.g., memory or logic devices) on the semiconductor substrate. Additionally, the high κ residue may contaminate process tools used in subsequent processing, thereby contaminating other semiconductor substrates through the contaminated process tools.

In view of the foregoing, various embodiments of the present application are directed to a method for forming an IC comprising an embedded memory boundary structure with a boundary sidewall spacer. In some embodiments, an isolation structure is formed in a semiconductor substrate to separate a memory region of the semiconductor substrate from a logic region of the semiconductor substrate. A multilayer film is formed covering the semiconductor substrate. A memory cell structure is formed on the memory region from the multilayer film. A first etch is performed into the multilayer film to remove the multilayer film from the logic region, such that the multilayer film at least partially defines a dummy sidewall on the isolation structure. A sidewall spacer layer is formed covering the memory cell structure, the isolation structure, and the logic region, and further lining the dummy sidewall. A second etch is performed into the sidewall spacer layer to form a sidewall spacer on dummy sidewall from the sidewall spacer layer. A logic device structure is formed on the logic region after forming the sidewall spacer.

The boundary sidewall spacer protects the dummy sidewall from damage while the logic device structure is formed so lateral undercutting, divots, and the like do not form along the dummy sidewall. Further, the boundary sidewall spacer may provide a smooth boundary sidewall that is not subject to damage during formation of the logic device structure (e.g., because of the material of the boundary sidewall, as seen hereafter) and, hence, is not subject to trapping high κ etch residue during formation of the logic device structure with HKMG technology. This, in turn, allows for complete removal of high κ etch residue, which increases yield and the reliability of semiconductor devices formed on the semiconductor substrate. Residual high κ etch residue may diffuse into the semiconductor substrate, and thereafter shift doping profiles of the semiconductor substrate and, hence, parameters of the semiconductor devices. Additionally, residual high κ etch residue may contaminate process tools, thereby contaminating other semiconductor substrates through the process tools.

With reference to FIG. 1A, a cross-sectional view 100A of some embodiments of an IC comprising a cell boundary structure 102 for embedded memory is provided. The cell boundary structure 102 is on a boundary region 104b of a semiconductor substrate 104. The boundary region 104b separates a memory region 104m of the semiconductor substrate 104 from a logic region 104l of the semiconductor substrate 104. The semiconductor substrate 104 may be or otherwise comprise, for example, a bulk silicon substrate, a group III-V substrate, a silicon-on-insulator (SOI) substrate, or some other suitable semiconductor substrate(s). As used herein, a term (e.g., semiconductor substrate) with a suffix of "(s)" may, for example, be singular or plural. Further, the cell boundary structure 102 overlaps a boundary isolation structure 106 on the boundary region 104b. The boundary isolation structure 106 extends into the boundary region 104b and provides physical and electrical separation between embedded memory 108 on the memory region 104m and a logic device 110 on the logic region 104l. The boundary isolation structure 106 may be or otherwise comprise, for example, a shallow trench isolation (STI) structure, a deep trench isolation (DTI) structure, some other suitable trench isolation structure(s), or some other suitable isolation structure(s).

The cell boundary structure 102 comprises a dummy structure 112 and a boundary sidewall spacer 114. The dummy structure 112 defines a dummy sidewall 112s that faces the logic device 110 and that comprises multiple different materials. The multiple different materials may comprise, for example, silicon nitride, silicon oxide, polysilicon, some other suitable material(s), or any combination of the foregoing. Further, in some embodiments, the dummy sidewall 112s is smooth, and/or vertical or substantially vertical. The boundary sidewall spacer 114 overlies the boundary isolation structure 106, laterally between the dummy structure 112 and the logic device 110, and borders the dummy sidewall 112s. In some embodiments, the boundary sidewall spacer 114 directly contacts the dummy sidewall 112s, and/or extends continuously along the dummy sidewall 112s from a bottommost edge of the dummy sidewall 112s to a topmost edge of the dummy sidewall 112s. The boundary sidewall spacer 114 may be or otherwise comprise, for example, silicon oxide, silicon nitride, silicon oxynitride, some other suitable dielectric(s), polysilicon, aluminum copper, tantalum, some other suitable metal(s) or metal alloy(s), tantalum nitride, titanium nitride, some other suitable metal nitride(s), or some other suitable material(s). Further, the boundary sidewall spacer 114 may be or otherwise comprise, for example, a homogeneous material (e.g., a single material).

A boundary sidewall 114s facing the logic device 110 is at least partially defined by the boundary sidewall spacer 114. In some embodiments, the boundary sidewall 114s is completely defined by the boundary sidewall spacer 114. In other embodiments, the boundary sidewall 114s is collectively defined by the boundary sidewall spacer 114 and the boundary isolation structure 106. In some of the other embodiments, a portion of the boundary sidewall 114s defined by the boundary isolation structure 106 is continuous with and/or flush with a portion of the boundary sidewall 114s defined by the boundary sidewall spacer 114. The boundary sidewall 114s is slanted downward towards the logic device 110. Further, the boundary sidewall 114s is smooth from top to bottom and, in some embodiments, arcs continuously from top to bottom. For example, the boundary sidewall 114s may be smooth and/or arc continuously from a top edge of the boundary sidewall 114s to a bottom edge of the boundary sidewall 114s. The top edge of the boundary sidewall 114s may, for example, be even or substantially even with a top edge of the dummy sidewall 112s and/or a top surface of the boundary sidewall spacer 114. The bottom edge of the boundary sidewall 114s may, for example, be spaced below a bottom edge of the dummy sidewall 112s and/or a bottom surface of the boundary sidewall spacer 114.

During formation of the IC, the boundary sidewall spacer 114 protects the dummy sidewall 112s from damage while the logic device 110 is formed. Absent the boundary sidewall spacer 114, lateral undercutting, divots, and the like may form along the dummy sidewall 112s and may trap high κ etch residue generated during formation of the logic device 110 with HKMG technology. Further, the boundary sidewall spacer 114 provides a smooth boundary sidewall 114s that is not subject to damage during formation of the logic device 110 (e.g., because of the material of the boundary sidewall 114s, as seen hereafter) and, hence, is not subject to trapping high κ etch residue generated during formation of the logic device 110 with HKMG technology. This, in turn, allows for complete removal of high κ etch residue generated during formation of the logic device 110 with HKMG technology, which increases yield and the reliability of semiconductor devices formed on the semiconductor substrate 104. As noted above, residual high κ etch residue may diffuse into the semiconductor substrate 104, and thereafter shift doping profiles of the semiconductor substrate 104 and, hence, parameters of the semiconductor devices formed on the semiconductor substrate 104.

In some embodiments, the dummy structure 112 comprises a dummy control gate electrode 116 and a dummy control gate dielectric layer 118 stacked on the boundary isolation structure 106. The dummy control gate electrode 116 overlies the dummy control gate dielectric layer 118, and the dummy control gate electrode 116 and the dummy control gate dielectric layer 118 collectively define the dummy sidewall 112s. The dummy control gate electrode 116 may be or otherwise comprise, for example, doped polysilicon, metal, some other suitable conductive material(s), or any combination of the foregoing. The dummy control gate dielectric layer 118 may be or otherwise comprise, for example, silicon oxide, silicon nitride, silicon oxynitride, some other suitable dielectric(s), or any combination of the foregoing. In some embodiments, the dummy control gate dielectric layer 118 comprises a multilayer oxide-nitride-oxide (ONO) film, the constituents of which are illustrated but not individually labeled for ease of illustration. See, for example, FIG. 1B for a complete labeling of the individual layers of the ONO film.

In some embodiments, the dummy structure 112 further comprises a dummy select gate electrode 120. The dummy select gate electrode 120 is on the boundary region 104b, laterally between the boundary isolation structure 106 and the embedded memory 108. Further, the dummy select gate electrode 120 has a bottom surface spaced below that of the dummy control gate dielectric layer 118. The dummy select gate electrode 120 overlies a dummy select gate dielectric layer 122, and is laterally spaced from the dummy control gate electrode 116 by a dummy gate spacer 124. The dummy gate spacer 124 overlies the boundary isolation structure 106. The dummy select gate electrode 120 may be or otherwise comprise, for example, doped polysilicon, metal, or some other suitable conductive material(s). The dummy select gate dielectric layer 122 and/or the dummy gate spacer 124 may be or otherwise comprise, for example, silicon oxide, silicon nitride, silicon oxynitride, some other suitable dielectric(s), or any combination of the foregoing.

The embedded memory 108 is on the memory region 104m and may be or otherwise comprise, for example, third generation embedded superflash (ESF3) memory, first generation embedded superflash (ESF1) memory, silicon-oxide-nitride-oxide-silicon (SONOS) memory, metal-oxide-nitride-oxide-silicon (MONOS) memory, or some other suitable type(s) of memory. In some embodiments, the embedded memory 108 comprises a pair of individual memory source/drain regions 126, a common memory source/drain region 128, and a pair of selectively-conductive memory channels 130. The individual memory source/drain regions 126 and the common memory source/drain region 128 are in a top of the semiconductor substrate 104, and the common memory source/drain region 128 is laterally spaced between the individual memory source/drain regions 126.

Further, the individual memory source/drain regions 126 and the common memory source/drain region 128 are doped semiconductor regions having a first doping type (e.g., p-type or n-type). The selectively-conductive memory channels 130 are in the top of the semiconductor substrate 104 and each extend from the common memory source/drain region 128 respectively to the individual memory source/drain regions 126. Further, the selectively-conductive memory channels 130 are doped semiconductor regions having a second doping type (e.g., p-type or n-type) opposite the first doping type.

A pair of floating gate dielectric layers 132, a pair of floating gate electrodes 134, a pair of control gate dielectric layers 136, and a pair of control gate electrodes 138 are stacked on the selectively-conductive memory channels 130. For ease of illustration, only one of the floating gate dielectric layers 132 is labeled 132, only one of the floating gate electrodes 134 is labeled 134, only one of the control gate dielectric layers 136 is labeled 136, and only one of the control gate electrodes 138 is labeled 138. The floating gate dielectric layers 132 respectively overlie the selectively-conductive memory channels 130 and may be or otherwise comprise, for example, silicon oxide or some other suitable dielectric(s). The floating gate electrodes 134 respectively overlie the floating gate dielectric layers 132, the control gate dielectric layers 136 respectively overlie the floating gate electrodes 134, and the control gate electrodes 138 respectively overlie the control gate dielectric layers 136. The control and floating gate electrodes 138, 134 may be or otherwise comprise, for example, doped polysilicon, metal, or some other suitable conductive material(s). The control gate dielectric layers 136 may be or otherwise comprise, for example, silicon nitride, silicon oxide, some other suitable dielectric(s), or any combination of the foregoing. In some embodiments, the control gate dielectric layers 136 each comprise ONO films, such that the control gate dielectric layers 136 each comprise a lower oxide layer 136l, an upper oxide layer 136u overlying the lower oxide layer 136l, and a middle nitride layer 136m sandwiched between the lower and upper oxide layers 136l, 136u. For ease of illustration, only one of the lower oxide layers 136l is labeled 136l, only one of the upper oxide layers 136u is labeled 136u, and only one of middle nitride layers 136m is labeled 136m.

A pair of control gate spacers 140 overlies each of the floating gate electrodes 134, and the control gate spacers 140 of each floating gate electrode respectively line opposite sidewalls of a control gate electrode overlying the floating gate electrode. For ease of illustration, only some of the control gate spacers 140 are labeled 140. Floating gate spacers 142 respectively overlie the selectively-conductive memory channels 130, each laterally spaced from the common memory source/drain region 128 by a respective one of the floating gate electrodes 134. Further, the floating gate spacers 142 each line a sidewall of the respective one of the floating gate electrodes 134. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 are each ONO films, the constituents of which are not shown for ease of illustration.

An erase gate electrode 144 and an erase gate dielectric layer 146 overlie the common memory source/drain region 128, laterally between the floating gate electrodes 134. The erase gate electrode 144 overlies the erase gate dielectric layer 146 and, in some embodiments, has a top surface even with top surfaces respectively of the control gate electrodes 138 and/or a top surface of the dummy structure 112. The erase gate dielectric layer 146 cups an underside of the erase gate electrode 144 to vertically space the erase gate electrode 144 from the common memory source/drain region 128, and to laterally space the erase gate electrode 144 from the floating gate electrodes 134 and the control gate spacers 140. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s).

A pair of select gate dielectric layers 148 and a pair of select gate electrodes 150 are stacked on the selectively-conductive memory channels 130. For ease of illustration, only one of the select gate dielectric layers 148 is labeled 148, and only one of the select gate electrodes 150 is labeled 150. The select gate dielectric layers 148 respectively overlie the selectively-conductive memory channels 130, each laterally spaced from the common memory source/drain region 128 by a respective one of the floating gate electrodes 134. The select gate dielectric layers 148 may be or otherwise comprise, for example, silicon oxide, silicon nitride, or some other suitable dielectric(s). The select gate electrodes 150 respectively overlie the select gate dielectric layers 148 and respectively border the floating gate spacers 142. The select gate electrodes 150 may be or otherwise comprise, for example, doped polysilicon, metal, or some other suitable conductive material(s).

The logic device 110 is on the logic region 104l and may be or otherwise comprise, for example, an insulated field-effect transistor (IGFET), a metal-oxide-semiconductor field-effect transistor (MOSFET), a double-diffused metal-oxide-semiconductor (DMOS) device, a bipolar complementary metal-oxide-semiconductor (CMOS) DMOS (BCD) device, some other suitable transistor device(s), or some other suitable semiconductor device(s). In some embodiments, the logic device 110 comprises a pair of logic source/drain regions 152 and a selectively-conductive logic channel 154. The logic source/drain regions 152 are in a top of the semiconductor substrate 104, and are laterally spaced. Further, the logic source/drain regions 152 are doped semiconductor regions having a first doping type (e.g., p-type or n-type). The selectively-conductive logic channel 154 is in the top of the semiconductor substrate 104 and extends from one of the logic source/drain regions 152 to another one of the logic source/drain regions 152. Further, the selectively-conductive logic channel 154 is a doped semiconductor region having a second doping type (e.g., p-type or n-type) opposite the first doping type.

A logic gate dielectric layer 156 overlies the selectively-conductive logic channel 154, and a logic gate electrode 158 overlies the logic gate dielectric layer 156. The logic gate electrode 158 may be or otherwise comprise, for example, doped polysilicon, metal, or some other suitable conductive material(s). The logic gate dielectric layer 156 may be or otherwise comprise, for example, silicon nitride, silicon oxide, a high κ dielectric, some other suitable dielectric(s), or any combination of the foregoing. As used herein, a high κ dielectric is a dielectric with a dielectric constant κ greater than about 3.9, 5, 10, 15, or 20. In some embodiments, the logic gate dielectric layer 156 is a high κ dielectric and the logic gate electrode 158 is metal, and/or the select gate electrodes 150, the erase gate electrode 144, the control gate electrodes 138, and the floating gate electrodes 134 are doped polysilicon.

In some embodiments, main sidewall spacers 160 line sidewalls of the select gate electrodes 150, a sidewall of the dummy select gate electrode 120, and sidewalls of the logic gate electrode 158. For ease of illustration, only some of the main sidewall spacers 160 are labeled 160. The main sidewall spacers 160 may be or otherwise comprise, for example, silicon nitride, silicon oxide, or some other suitable dielectric(s). Further, in some embodiments, an interlayer dielectric (ILD) layer 162 covers the embedded memory 108, the logic device 110, and the cell boundary structure 102. The ILD layer 162 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9, 3, 2, or 1. Further yet, in some embodiments, contact vias 164 extend through the ILD layer 162 to the logic source/drain regions 152 and the individual memory source/drain regions 126. The contact vias 164 are conductive and may be or otherwise comprise, for example, tungsten, aluminum copper, copper, aluminum, some other suitable metal(s), or some other suitable conductive material(s).

Figure 1B:
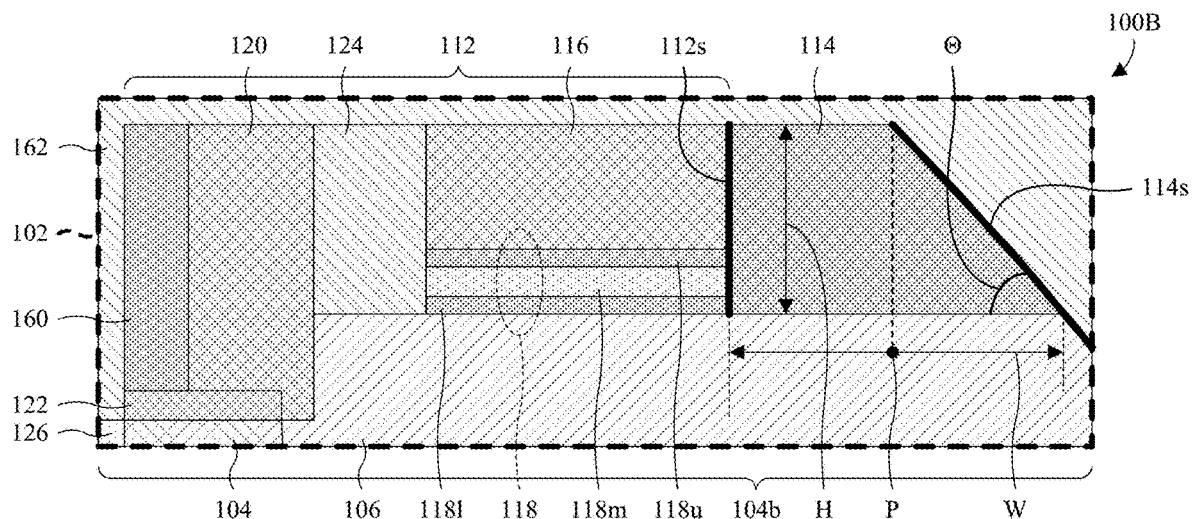

With reference to FIG. 1B, an enlarged cross-sectional view 100B of some embodiments of the cell boundary structure 102 in FIG. 1A is provided. In some embodiments, the dummy control gate dielectric layer 118 comprises a lower oxide layer 118l, an upper oxide layer 118u overlying the lower oxide layer 118l, and a middle nitride layer 118m vertically sandwiched between the lower oxide layer 118l and the upper oxide layer 118u. Further, in such embodiments, the dummy sidewall 112s is heterogeneous and comprises at least three different materials (e.g., silicon nitride, silicon oxide, and polysilicon).

In some embodiments, a width W of the boundary sidewall spacer 114 increases continuously from top to bottom. The width W may, for example, be between about 50-10,000 angstroms, between about 50-5,000 angstroms, or between about 5,000-10,000 angstroms. In some embodiments, a height H of the boundary sidewall spacer 114 is uniform or substantially uniform laterally from the dummy sidewall 112s to a midpoint P along the width W of the boundary sidewall spacer 114. Further, in some embodiments, the height H of the boundary sidewall spacer 114 decreases continuously along the width W, from the midpoint P to an opposite side of the boundary sidewall spacer 114 as the dummy sidewall 112s. The height H may, for example, be between about 50-10,000 angstroms, between about 50-5,000 angstroms, or between about 5,000-10,000 angstroms.

The boundary sidewall 114s is slanted downward, away from the dummy sidewall 112s, and has a slant angle θ relative to a bottom surface of the boundary sidewall spacer 114. The slant angle θ may be or otherwise comprise, for example, less than about 50 degrees, about 60 degrees, about 75 degrees, or about 80 degrees, and/or may be or otherwise comprise, for example, between about 70-80 degrees, about 50-80 degrees, or about 60-70 degrees.

While FIGS. 1A and 1B illustrates specific configurations for the dummy structure 112, the embedded memory 108, and the logic device 110, it is to be understand that other configurations of the dummy structure 112, the embedded memory 108, the logic device 110, or any combination of the foregoing are amenable. For example, a different embedded memory type may be employed in place of the embedded memory 108 (see FIG. 1A).

Figure 2A:
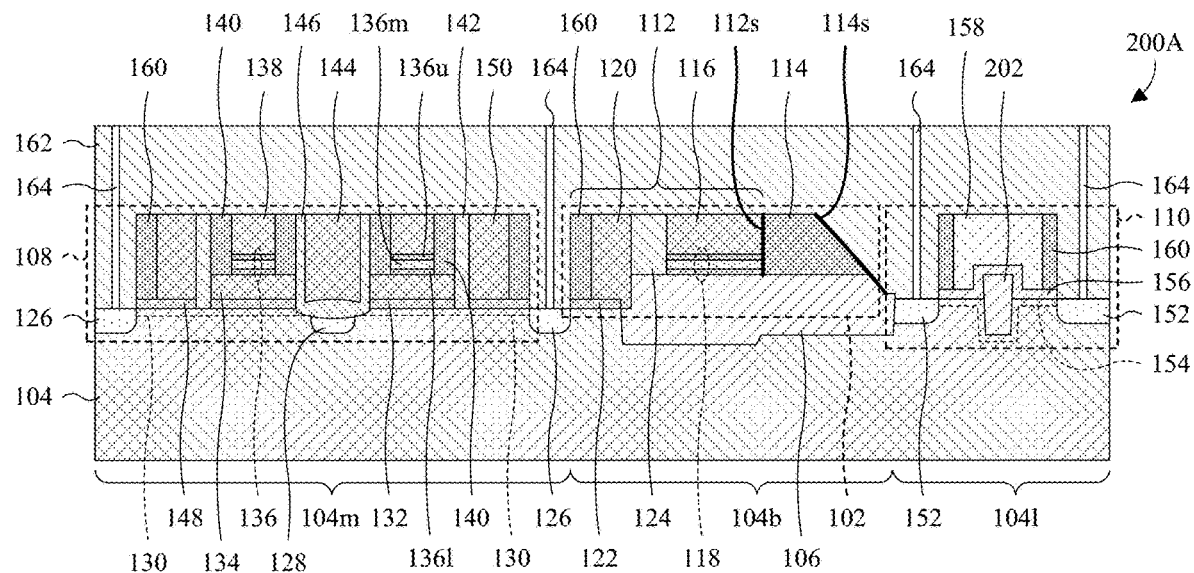
FIGS. 2A and 2B illustrate cross-sectional views of various other embodiments of the IC of FIG. 1.
Figure 2B:
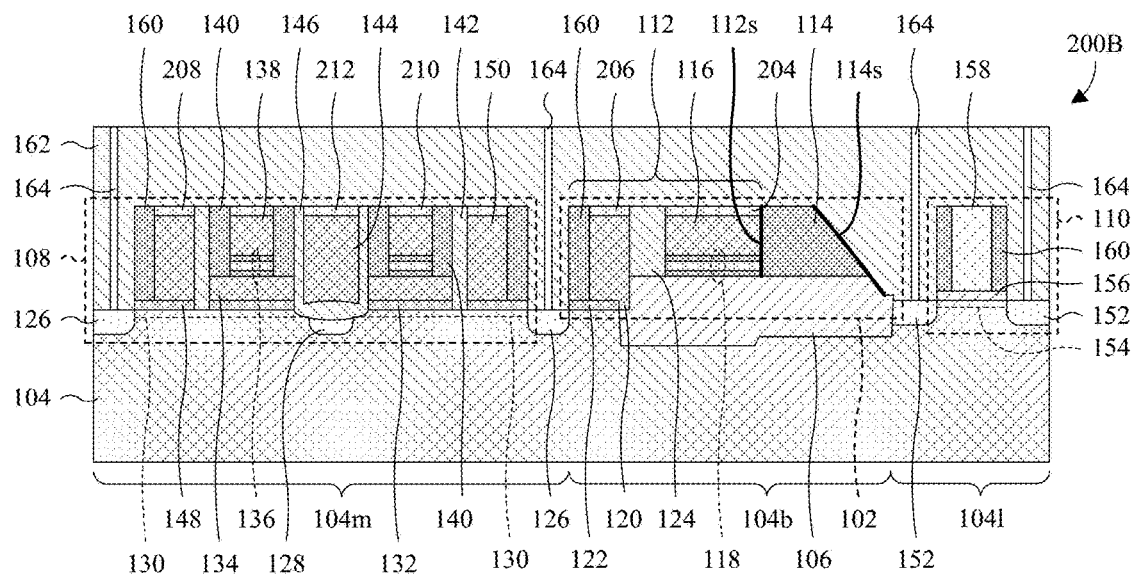

With reference to FIGS. 2A and 2B, cross-sectional views 200A, 200B of various other embodiments of the IC of FIGS. 1A and 1B are provided. As illustrated by the cross-sectional view 200A of FIG. 2A, the logic gate electrode 158 and the logic gate dielectric layer 156 straddle a logic isolation structure 202 extending into a top of the logic region 104*l*. Further, the selectively-conductive logic channel 154 conforms to and cups an underside of the logic isolation structure 202. The logic isolation structure 202 may be or otherwise comprise, for example, an STI structure, a DTI structure, some other suitable trench isolation structure(s), or some other suitable isolation structure(s).

As illustrated by the cross-sectional view 200B of FIG. 2B, the cell boundary structure 102 further comprises a dummy control gate hard mask 204 and a dummy select gate hard mask 206. The dummy control gate hard mask 204 overlies the dummy control gate electrode 116, and the dummy select gate hard mask 206 overlies the dummy select gate electrode 120. Further, the embedded memory 108 comprises a pair of select gate hard masks 208, a pair of control gate hard masks 210, and an erase gate hard mask 212. For ease of illustration, only one of the select gate hard masks 208 is labeled 208, and only one of the control gate hard masks 210 is labeled 210. The select gate hard masks 208 respectively overlie the select gate electrodes 150, and the control gate hard masks 210 respectively overlie the control gate electrodes 138. As above, only one of the select gate electrodes 150 is labeled 150, and only one of the control gate electrodes 138 is labeled 138. The erase gate hard mask 212 overlies the erase gate electrode 144. The dummy control gate hard mask 204, the dummy select gate hard mask 206, the select gate hard masks 208, the control gate hard masks 210, and the erase gate hard mask 212 may each be or otherwise comprise, for example, silicon nitride, silicon oxide, some other suitable dielectric(s), or any combination of the foregoing.

As illustrated by the cross-sectional view 300 of FIG. 3, a cross-sectional view 300 of some more detailed embodiments of the integrated circuit of FIGS. 1A and 1B is provided. As illustrated, a dummy liner layer 302 underlies the main sidewall spacers 160 on the memory and boundary regions 104*m*, 104*b*, and further spaces the main sidewall spacers 160 from the select gate electrodes 150 and the dummy select gate electrode 120. As above, only some of the main sidewall spacers 160 are labeled 160, and only one of the select gate electrodes 150 is labeled 150. The dummy liner layer 302 may be or otherwise comprise, for example, silicon oxide, silicon nitride, some other suitable dielectric(s), or any combination of the foregoing.

A logic boundary structure 304 overlies the boundary isolation structure 106 on an opposite side of the boundary isolation structure 106 as the cell boundary structure 102. The logic boundary structure 304 comprises a dummy logic gate dielectric layer 306 and a dummy logic gate electrode 308 overlying the dummy logic gate dielectric layer 306. The dummy logic gate electrode 308 may be or otherwise comprise, for example, doped polysilicon, metal, or some other suitable conductive material(s). The dummy logic gate dielectric layer 306 may be or otherwise comprise, for example, silicon nitride, silicon oxide, a high κ dielectric, some other suitable dielectric(s), or any combination of the foregoing. In some embodiments, the main sidewall spacers 160 comprise a pair of main sidewall spacers respectively lining opposite sides of the dummy logic gate electrode 308, and/or overlying the dummy logic gate dielectric layer 306.

A first logic device 110*a* and a second logic device 110*b* are on the logic region 104*l* of the semiconductor substrate 104, physically and electrically separated by a logic isolation structure 310 laterally between the first and second logic devices 110*a*, 110*b*. The logic isolation structure 310 extends into a top of the semiconductor substrate 104 and may be or otherwise comprise, for example, an STI structure, a DTI structure, or some other suitable isolation structure(s). The first and second logic devices 110*a*, 110*b* may each be, for example, an IGFET, a MOSFET, a DMOS device, a BCD device, some other suitable transistor device(s), or some other suitable semiconductor device(s). In some embodiments, the second logic device 110*b* is an IGFET and the first logic device 110*a* is a power MOFSET configured to operate at higher voltages (e.g., voltages an order of magnitude higher) than the second logic device 110*b*. The power MOSFET may be or otherwise comprise, for example, a double-diffused metal-oxide-semiconductor (DMOS) device or some other suitable power MOSFET(s).

The first and second logic devices 110*a*, 110*b* each comprise a pair of logic source/drain regions 152 and a selectively-conductive logic channel 154. For ease of illustration, only some of the logic source/drain regions 152 are labeled 152. The logic source/drain regions 152 of each pair are in a top of the semiconductor substrate 104 and are laterally spaced. Further, the logic source/drain regions 152 of each pair are doped semiconductor regions having a first doping type (e.g., p-type or n-type). The selectively-conductive logic channels 154 are in the top of the semiconductor substrate 104, and each of the selectively-conductive logic channels 154 is between and adjoins the logic source/drain regions 152 of a respective pair of logic source/drain regions 152. Further, each of the selectively-conductive logic channels 154 is a doped semiconductor region having a second doping type (e.g., p-type or n-type) opposite the first doping type of the respective pair of logic source/drain regions 152.

A pair of first logic gate dielectric layers 156*a*, a pair of second logic gate dielectric layers 156*b*, and a pair of logic gate electrodes 158 are stacked on the selectively-conductive logic channels 154. For ease of illustration, only one of the first logic gate dielectric layers 156*a* is labeled 156*a*. The first logic gate dielectric layers 156*a* respectively overlie the selectively-conductive logic channels 154, the second logic gate dielectric layers 156*b* respectively overlie the first logic gate dielectric layers 156*a*, and the logic gate electrodes 158 respectively overlie the second logic gate dielectric layers 156*b*. The logic gate electrodes 158 may be or otherwise comprise, for example, doped polysilicon, metal, or some other suitable conductive material(s). The first and second logic gate dielectric layer 156*a*, 156*b* may be or otherwise comprise, for example, silicon nitride, silicon oxide, a high κ dielectric, some other suitable dielectric(s), or any combination of the foregoing. In some embodiments, the first logic gate dielectric layers 156*a* are silicon oxide, the second logic gate dielectric layers 156*b* are a high κ dielectric, and the logic gate electrodes 158 are metal. In some embodiments, the main sidewall spacers 160 comprise a plurality of main sidewall spacers respectively lining sidewalls of the logic gate electrodes 158.

A lower ILD layer 162*l* and an upper ILD layer 162*u* are stacked on the semiconductor substrate 104 and accommodate the contact vias 164. For ease of illustration, only some of the contact vias 164 are labeled 164. The lower ILD layer 162*l* is to the sides of the embedded memory 108, laterally between the cell boundary structure 102 and the logic boundary structure 304, and to the sides of the first and second logic devices 110*a*, 110*b*. Further, the lower ILD layer 162*l* has a top surface that is even (e.g., planar or substantially planar) with a top surface of the embedded memory 108, a top surface of the cell boundary structure 102, a top surface of the logic boundary structure 304, a top surface of the first logic device 110a, and a top surface of the second logic device 110b. The upper ILD layer 162u covers the lower ILD layer 162l, the embedded memory 108, the cell boundary structure 102, the logic boundary structure 304, the first logic device 110a, and the second logic device 110b. The lower and upper ILD layers 162l, 162u may be or otherwise comprise, for example, silicon oxide, silicon nitride, a low κ dielectric, some other suitable dielectric(s), or any combination of the foregoing.

In some embodiments, the dummy select gate electrode 120 and the dummy control gate electrode 116 are laterally spaced by a first dummy gate spacer 124a and a second dummy gate spacer 124b. The first and second dummy gate spacers 124a, 124b overlie the boundary isolation structure 106, laterally between the dummy select gate electrode 120 and the dummy control gate electrode 116. The first and second dummy gate spacers 124a, 124b may be or otherwise comprise, for example, silicon nitride, silicon oxide, some other suitable dielectric(s) or any combination of the foregoing. In some embodiments, the first dummy gate spacer 124a is an ONO film, the constituents of which are illustrated but not labeled for ease of illustration.

Further, in some embodiments, the control gate spacers 140 overlying the floating gate electrodes 134 are or otherwise comprise ONO films, and/or silicide pads 312 respectively overlie the logic source/drain regions 152 and the individual memory source/drain regions 126. For ease of illustration, only one of the control gate spacers 140 is labeled 140, and only some of the silicide pads 312 are labeled 312. The ONO films may, for example, each comprises a first oxide layer 140f, a second oxide layer 140s, and a middle nitride layer 140m laterally sandwiched between the first and second oxide layers 140f, 140s. The silicide pads 312 may be or otherwise comprise, for example, nickel silicide or some other suitable silicide(s).

With reference to FIGS. 4-37, a series of cross-sectional views 400-3700 illustrate some embodiments of a method for forming an IC comprising an embedded memory boundary structure with a boundary sidewall spacer.

As illustrated by the cross-sectional view 400 of FIG. 4, a boundary isolation structure 106 is formed in a boundary region 104b of a semiconductor substrate 104. The boundary region 104b separates a memory region 104m of the semiconductor substrate 104 from a logic region 104l of the semiconductor substrate 104, and the boundary isolation structure 106 provides electrical separation between semiconductor devices formed hereafter on the memory region 104m and the logic region 104l. The boundary isolation structure 106 may, for example, have a stepped bottom surface stepping up from the memory region 104m to the logic region 104l, and/or may, for example, comprise a dielectric material. Further, the boundary isolation structure 106 may be or otherwise comprise, for example, a STI structure, a DTI structure, or some other suitable isolation region(s). The semiconductor substrate 104 may be or otherwise comprise, for example, a bulk silicon substrate, a SOI substrate, a group III-V substrate, or some other suitable semiconductor substrate(s).

Also illustrated by the cross-sectional view 400 of FIG. 4, a logic isolation structure 310 is formed in the logic region 104l to divide the logic region 104l into a first logic region 104l$_1$ and a second logic region 104l$_2$. The first logic region 104l$_1$ is laterally between the boundary isolation structure 106 and the second logic region 104l$_2$. The second logic region 104l$_2$ may, for example, support core logic devices formed hereafter, whereas the first logic region 104l$_1$ may, for example, support high voltage logic devices formed hereafter. The high voltage logic devices may, for example, be logic devices configured to operate at higher voltages (e.g., an order of magnitude higher) than the core logic devices. The logic isolation structure 310 may, for example, comprise a dielectric material, and/or may be or otherwise comprise, for example, a STI structure, a DTI structure, or some other suitable isolation region(s).

In some embodiments, a process for forming the boundary isolation structure 106 and the logic isolation structure 310 comprises forming a lower pad layer 402 covering the semiconductor substrate 104, and further forming an upper pad layer 404 covering the lower pad layer 402. The lower and upper pad layers 402, 404 are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The lower pad layer 402 may, for example, be formed of silicon oxide or some other suitable dielectric(s), and/or the upper pad layer 404 may, for example, be formed by silicon nitride or some other suitable dielectric(s). The lower and upper pad layers 402, 404 are patterned with layouts of the boundary and logic isolation structures 106, 310, and an etch is performed into the semiconductor substrate 104 with the lower and upper pad layers 402, 404 in place to form trenches with the layouts. A dielectric layer is formed covering the upper pad layer 404 and filling the trenches, and a planarization is performed to the upper pad layer 404 to form the boundary and logic isolation structures 106, 310 in the trenches. The dielectric layer may, for example, be formed of silicon oxide or some other suitable dielectric material(s), and/or may, for example, be performed by CVD, PVD, sputtering, or some other suitable deposition process(es). The planarization may, for example, be performed by a chemical mechanical polish (CMP) or some other suitable planarization process(es). The patterning may, for example, be performed using photolithography and an etching process.

As illustrated by the cross-sectional view 500 of FIG. 5, an etch is performed into the upper pad layer 404 to remove the upper pad layer 404 from the memory region 104m, but not the logic region 104l. In some embodiments, a process for performing the etch comprises forming and patterning a photoresist layer 502 on the upper pad layer 404, such that the photoresist layer 502 covers the logic region 104l, but not the memory region 104m. An etchant is then applied to the upper pad layer 404 with the photoresist layer 502 in place until the upper pad layer 404 is removed from the memory region 104m, and the photoresist layer 502 is thereafter stripped.

As illustrated by the cross-sectional view 600 of FIG. 6, a floating gate layer 602 is formed covering the memory region 104m, the boundary region 104b, and the logic region 104l. The floating gate layer 602 may, for example, be formed conformally, and/or may, for example, be formed of doped polysilicon, metal, or some other suitable conductive material(s). In some embodiments, the floating gate layer 602 is formed by CVD, PVD, or some other suitable deposition process(es).

Figure 7:
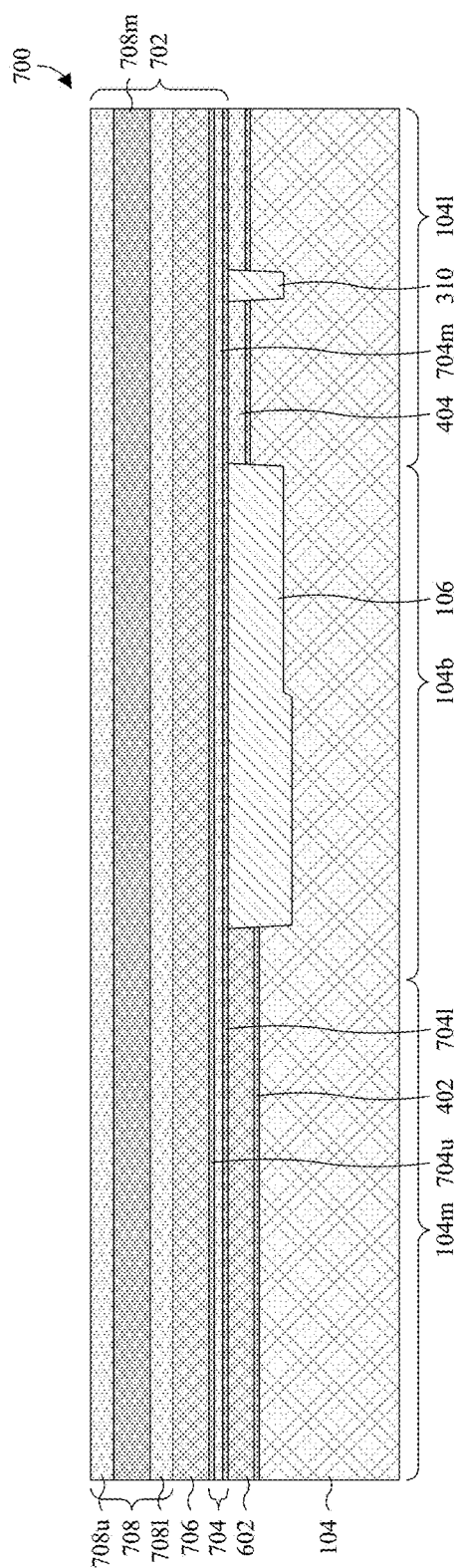

As illustrated by the cross-sectional view 700 of FIG. 7, a planarization is performed into a top of the floating gate layer 602 until the boundary isolation structure 106 is reached, thereby removing the floating gate layer 602 from the boundary isolation structure 106 and the logic region 104l. In some embodiments, the planarization recesses a topmost surface of the floating gate layer 602 to about even with a topmost surface of the boundary isolation structure 106 and the upper pad layer 404. The planarization may, for example, be performed by a CMP or some other suitable planarization process(es).

Also illustrated by the cross-sectional view 700 of FIG. 7, a multilayer memory film 702 is formed covering the floating gate layer 602, the boundary and logic isolation structures 106, 310, and the upper pad layer 404. The multilayer memory film 702 comprises a control gate dielectric layer 704, a control gate layer 706, and a control gate hard mask layer 708.

The control gate dielectric layer 704 is formed covering the floating gate layer 602, the boundary and logic isolation structures 106, 310, and the upper pad layer 404. In some embodiments, the control gate dielectric layer 704 comprises silicon oxide, silicon nitride, some other suitable dielectric(s), or any combination of the foregoing. For example, the control gate dielectric layer 704 may be an ONO film, and/or may comprise a lower oxide layer 704$l$, a middle nitride layer 704$m$ covering the lower oxide layer 704$l$, and an upper oxide layer 704$u$ covering the middle nitride layer 704$m$. The control gate dielectric layer 704 may, for example, be formed by CVD, PVD, some other suitable deposition process(es), or any combination of the foregoing.

The control gate layer 706 is formed covering the control gate dielectric layer 704. The control gate layer 706 may, for example, be formed conformally, and/or may, for example, be formed of doped polysilicon, metal, or some other suitable conductive material(s). In some embodiments, a process for forming the control gate layer 706 comprises depositing the control gate layer 706, implanting dopants into the control gate layer 706, and annealing the control gate layer 706 to activate the dopants. Further, in some embodiments, the control gate layer 706 is formed by CVD, PVD, or some other suitable deposition process(es).

The control gate hard mask layer 708 is formed covering the control gate layer 706. In some embodiments, the control gate hard mask layer 708 comprises silicon oxide, silicon nitride, some other suitable dielectric(s), or any combination of the foregoing. For example, the control gate hard mask layer 708 may be a nitride-oxide-nitride (NON) film, and/or may comprise a lower nitride layer 708$l$, a middle oxide layer 708$m$ covering the lower nitride layer 708$l$, and an upper nitride layer 708$u$ covering the middle oxide layer 708$m$. The control gate hard mask layer 708 may, for example, be formed by CVD, PVD, some other suitable deposition process(es), or any combination of the foregoing.

Figure 8:
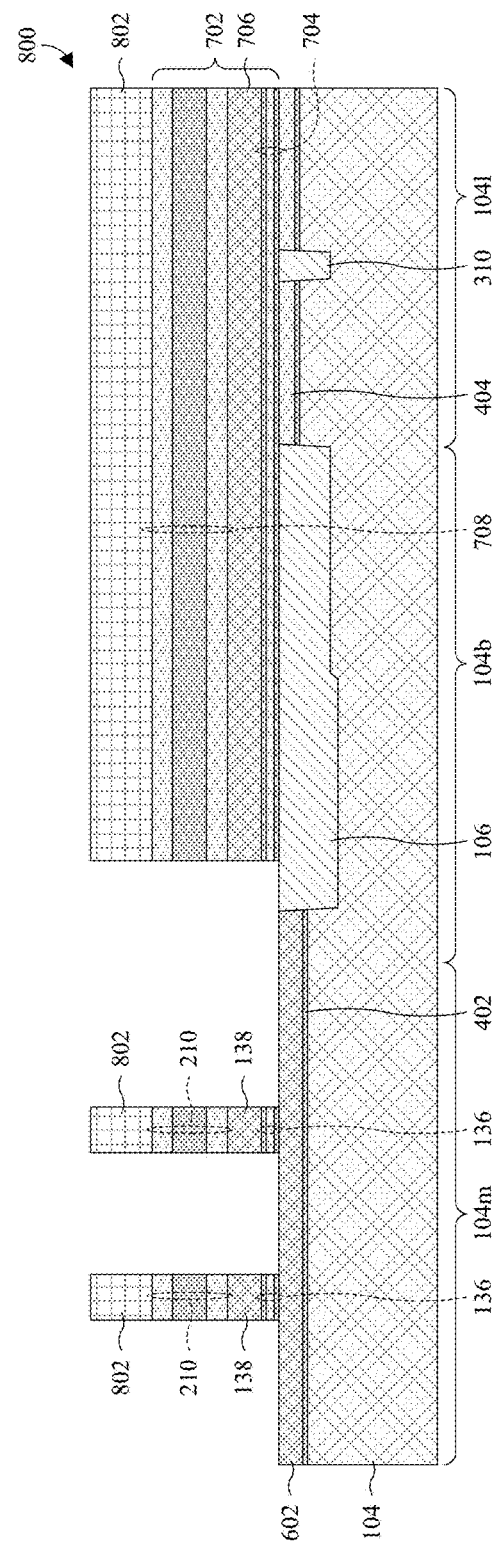

As illustrated by the cross-sectional view 800 of FIG. 8, an etch is performed into the multilayer memory film 702 to remove portions of the multilayer memory film 702 from the memory region 104$m$, thereby forming a pair of control gate electrodes 138 on the floating gate layer 602. Further, the etch forms a pair of control gate dielectric layers 136 and a pair of control gate hard masks 210. The control gate dielectric layers 136 respectively underlie the control gate electrodes 138, and the control gate hard masks 210 respectively overlie the control gate electrodes 138. In some embodiments, a process for performing the etch comprises forming and patterning a photoresist layer 802 on the multilayer memory film 702. The photoresist layer 802 is patterned so as to cover the boundary region 104$b$ and the logic region 104$l$, and so as to partially cover the memory region 104$m$ with a layout of the control gate electrodes 138. An etchant is then applied to the multilayer memory film 702 with the photoresist layer 802 in place until the etchant reaches the floating gate layer 602, and the photoresist layer 802 is thereafter stripped.

As illustrated by the cross-sectional view 900 of FIG. 9, a control gate spacer layer 902 is formed covering and lining the structure of FIG. 8. The control gate spacer layer 902 may, for example, be formed conformally, and/or may, for example, be formed of silicon oxide, silicon nitride, some other suitable dielectric(s), or any combination of the foregoing. In some embodiments, the control gate spacer layer 902 is or otherwise comprise an ONO film, and/or comprises a lower oxide layer 902$l$, a middle nitride layer 902$m$ overlying the lower oxide layer 902$l$, and an upper oxide layer 902$u$ overlying the middle nitride layer 902$m$. Further, the control gate spacer layer 902 may, for example, be formed by CVD, PVD, or some other suitable deposition process(es).

As illustrated by the cross-sectional view 1000 of FIG. 10, an etch is performed into the control gate spacer layer 902 (see FIG. 9) to form control gate spacers 140 along sidewalls of the control gate electrodes 138. Further, the etch forms a first dummy gate spacer 124$a$ overlying the boundary isolation structure 106, along a sidewall of the multilayer memory film 702 facing the memory region 104$m$. In some embodiments, a process for performing the etch comprises applying one or more etchants to the control gate spacer layer 902 until horizontal segments of the control gate spacer layer 902 are removed.

Also illustrated by the cross-sectional view 1000 of FIG. 10, an etch is performed into the floating gate layer 602 (see FIG. 9) and the lower pad layer 402, with the control gate spacers 140 and the first dummy gate spacer 124$a$ in place, to form a pair of floating gate electrodes 134 and a pair of floating gate dielectric layers 132. The floating gate electrodes 134 respectively underlie the control gate electrodes 138 and are formed from the floating gate layer 602. The floating gate dielectric layers 132 respectively underlie the floating gate electrodes 134 and are formed from the lower pad layer 402. During the etch, the control gate spacers 140 and the control gate hard masks 210 serve as a mask.

Figure 11:
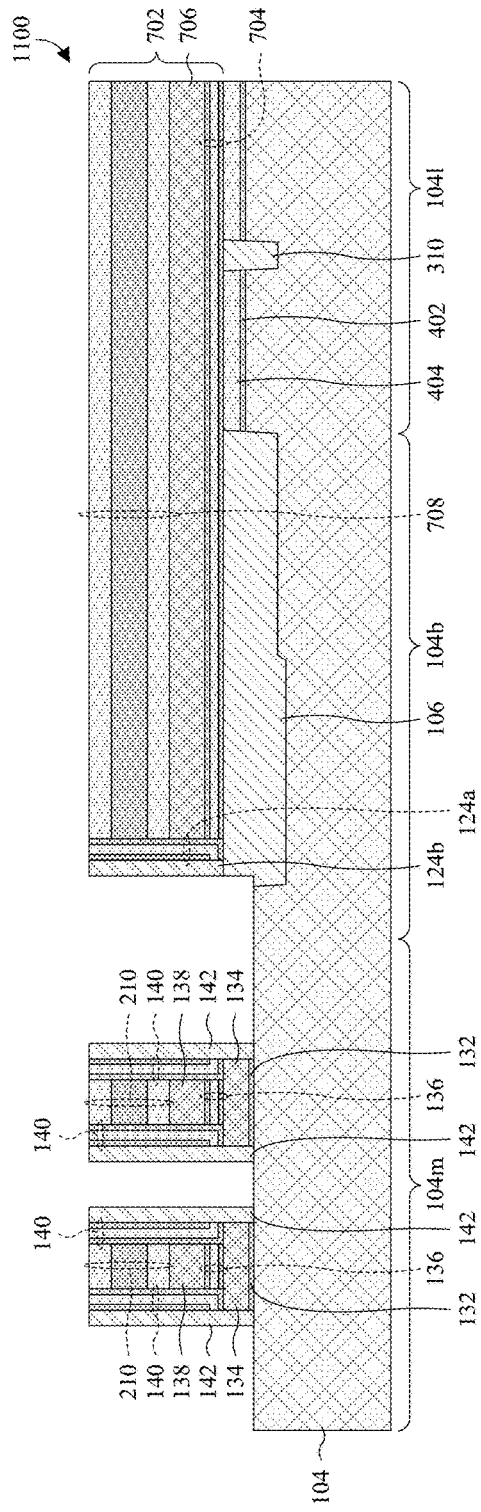

As illustrated by the cross-sectional view 1100 of FIG. 11, floating gate spacers 142 are formed on sidewalls of the floating gate electrodes 134 and the control gate spacers 140. Further, a second dummy gate spacer 124$b$ is formed on a sidewall of the first dummy gate spacer 124$a$. In some embodiments, the floating gate spacers 142 and the second dummy gate spacer 124$b$ comprise silicon oxide, some other suitable oxide(s), or some other suitable dielectric(s). Further, in some embodiments, a process for forming the floating gate spacers 142 and the second dummy gate spacer 124$b$ comprises depositing a floating gate spacer layer covering and lining the structure of FIG. 10. An etch is then performed into the floating gate spacer layer to remove horizontal segments of the floating gate spacer layer without removing vertical segments of the floating gate spacer layer. The floating gate spacer layer may, for example, be deposited conformally, and/or may, for example, be formed by CVD, PVD, or some other suitable deposition process(es).

Figure 12:
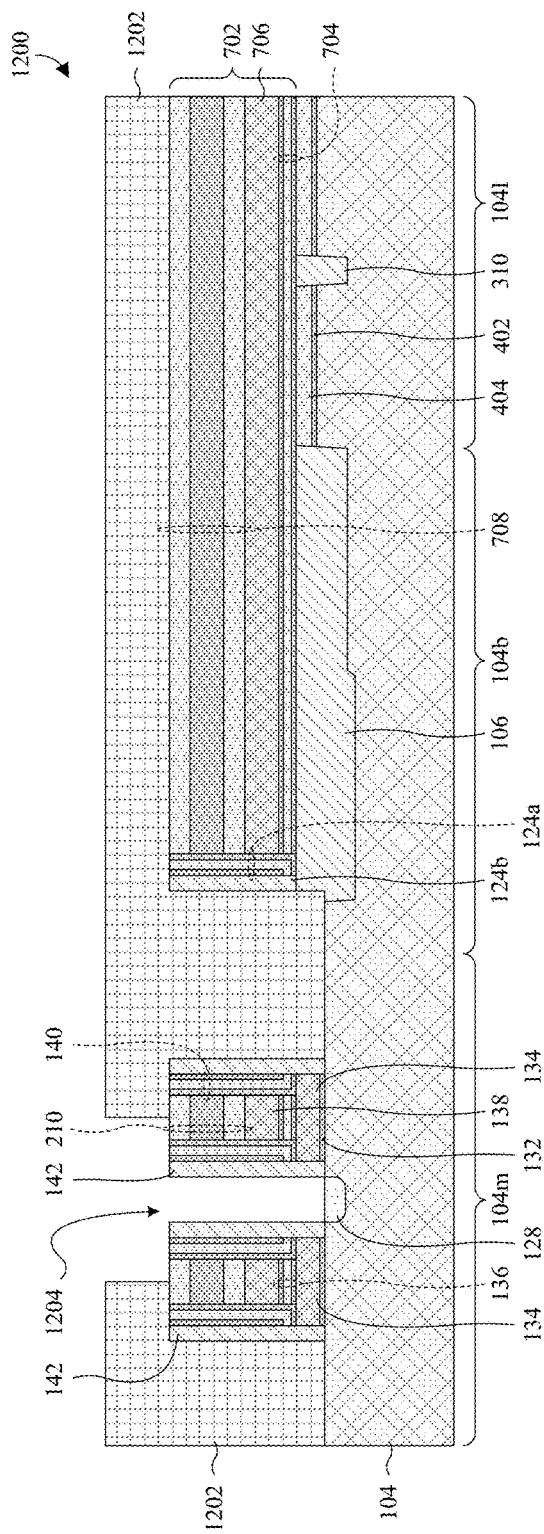

As illustrated by the cross-sectional view 1200 of FIG. 12, a common memory source/drain region 128 is formed in the semiconductor substrate 104, laterally between the floating gate electrodes 134. In some embodiments, a process for forming the common memory source/drain region 128 comprises forming and patterning a photoresist layer 1202 covering the logic and boundary regions 104$l$, 104$b$, and further covering the memory region 104$m$ outside a common source/drain gap 1204 laterally between the floating gate electrodes 134. Ion implantation or some other suitable doping process(es) is performed with the photoresist layer 1202 in place, and the photoresist layer 1202 is thereafter removed. The photoresist layer 1202 may, for example, be patterned using photolithography.

As illustrated by the cross-sectional view 1300 of FIG. 13, an etch is performed into the floating gate spacers 142 to remove floating gate spacers 142 within the common source/drain gap 1204. In some embodiments, a process for performing the etch comprises applying an etchant to the floating gate spacers 142 with the photoresist layer 1202 of FIG. 12 in place until exposed floating gate spacers are removed from the common source/drain gap 1204. The photoresist layer 1202 is thereafter stripped.

As illustrated by the cross-sectional view 1400 of FIG. 14, an erase gate dielectric layer 146 is formed covering the common memory source/drain region 128, and further lining sidewalls of the floating gate electrodes 134 and sidewalls of the control gate spacers 140 within the common source/drain gap 1204 (see FIG. 13). The erase gate dielectric layer 146 may, for example, be formed of oxide, nitride, or some other suitable dielectric(s). In some embodiments, a process for forming the erase gate dielectric layer 146 comprises high temperature oxidation (HTO), in situ steam generation (ISSG) oxidation, some other suitable deposition or growth process(es), or any combination of the foregoing. Further, in some embodiments, the process comprises removing dielectric material that forms on portions of the memory region 104m outside the common source/drain gap 1204. The removal may, for example, comprise forming and patterning a photoresist layer 1402 covering the common memory source/drain region 128 and overhanging the control gate hard masks 210. An etchant is applied to the dielectric material to be removed with the photoresist layer 1402 in place, and the photoresist layer 1402 is subsequently removed. The patterning may, for example, be performed using photolithography.

As illustrated by the cross-sectional view 1500 of FIG. 15, a memory dielectric layer 1502 is formed covering portions of the memory region 104m on opposite sides of the floating gate electrodes 134 as the common memory source/drain region 128. The memory dielectric layer 1502 may, for example, be formed of oxide, nitride, or some other suitable dielectric(s). The memory dielectric layer 1502 may, for example, be formed by HTO, ISSG oxidation, some other suitable deposition or growth process(es), or any combination of the foregoing.

Also illustrated by the cross-sectional view 1500 of FIG. 15, a memory gate layer 1504 is formed covering the memory dielectric layer 1502 and the other structure on the memory, logic, and boundary regions 104m, 104l, 104b. The memory gate layer 1504 may, for example, be formed conformally, and/or may, for example, be formed of doped polysilicon, metal, or some other suitable conductive material(s). The memory gate layer 1504 may, for example, be formed by CVD, PVD, or some other suitable deposition process(es).

Also illustrated by the cross-sectional view 1500 of FIG. 15, a memory antireflective coating (ARC) 1506 is formed covering the memory gate layer 1504. Further, the memory ARC 1506 may, for example, be formed with a top surface that is planar or substantially planar. In some embodiments, a process for forming the memory ARC 1506 comprises depositing the memory ARC 1506, and subsequently performing a planarization into the top surface of memory ARC 1506. The planarization may, for example, be performed by a CMP or some other suitable planarization process(es).

As illustrated by the cross-sectional view 1600 of FIG. 16, an etch is performed into the memory gate layer 1504 and the memory ARC 1506 (see FIG. 15) until the memory ARC 1506 is removed and a top surface of the memory gate layer 1504 is about even with top surfaces of the control gate electrodes 138. The etch is performed with an etchant that has the same or substantially the same etch rate for the memory ARC 1506 as for the memory gate layer 1504. As such, the memory ARC 1506 is etched back until the memory gate layer 1504 is exposed. At that point, the memory gate layer 1504 and the memory ARC 1506 are etched back together until the memory ARC 1506 is completely removed. The memory gate layer 1504 is then etched back until the top surface of the memory gate layer 1504 is about even with top surfaces of the control gate electrodes 138. In some embodiments, after the etch, dopants are implanted into the memory gate layer 1504, and an anneal is subsequently performed to activate the dopants.

Figure 17:
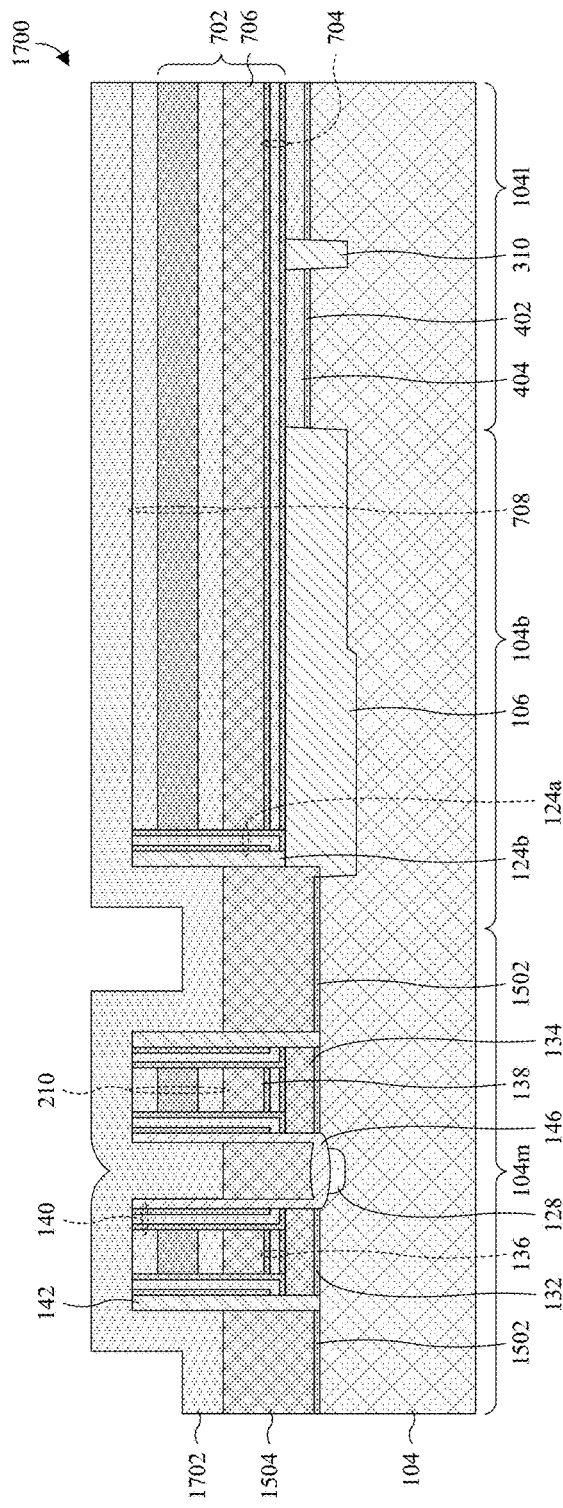

As illustrated by the cross-sectional view 1700 of FIG. 17, a memory hard mask layer 1702 is formed covering the structure of FIG. 16. The memory hard mask layer 1702 may, for example, be formed conformally, and/or may, for example, be formed of silicon nitride, silicon oxide, or some other suitable dielectric(s). Further, the memory hard mask layer 1702 may be formed by CVD, PVD, or some other suitable deposition process(es).

Figure 18:
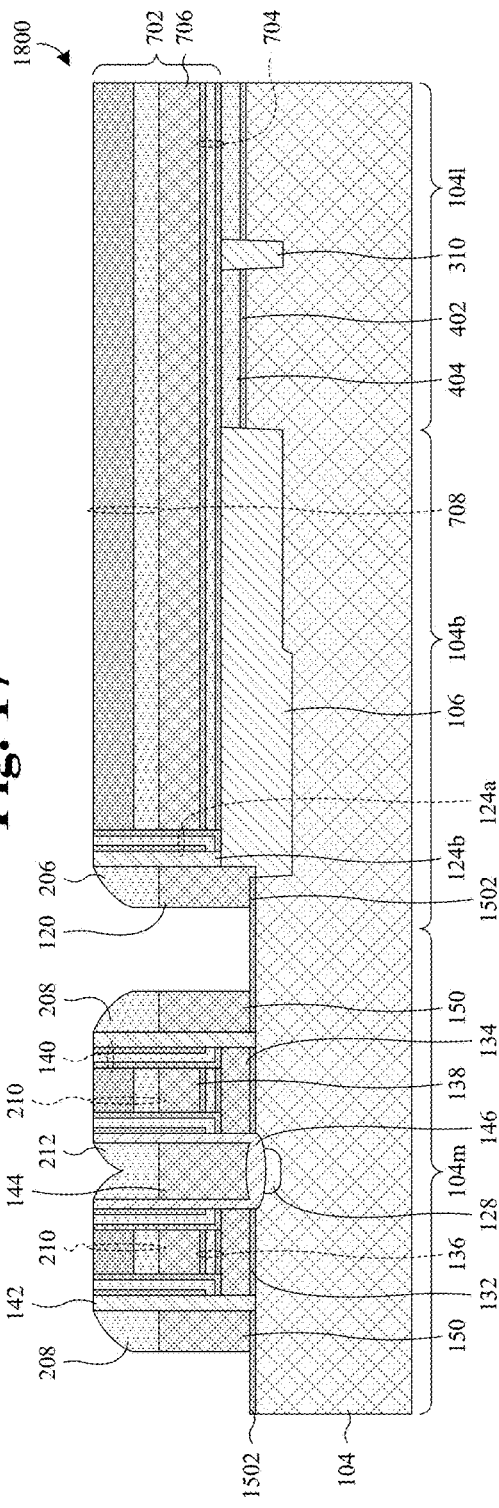

As illustrated by the cross-sectional view 1800 of FIG. 18, an etch is performed into the memory hard mask layer 1702 (see FIG. 17) to form a pair of select gate hard masks 208 on opposite sides of the common memory source/drain region 128. Further, the etch forms an erase gate hard mask 212 overlying the common memory source/drain region 128, and a dummy select gate hard mask 206 bordering a sidewall of the boundary isolation structure 106. In some embodiments, a process for performing the etch comprises applying one or more etchants to the memory hard mask layer 1702 until horizontal segments of the memory hard mask layer 1702 are removed. Further, in some embodiments, the etch partially removes the control gate hard masks 210 and/or the control gate hard mask layer 708.

Also illustrated by the cross-sectional view 1800 of FIG. 18, an additional etch is performed into the memory gate layer 1504 (see FIG. 17) with the select gate hard masks 208, the erase gate hard mask 212, and the dummy select gate hard mask 206 in place. The second etch forms a pair of select gate electrodes 150, an erase gate electrode 144, and a dummy select gate electrode 120. The select gate electrodes 150 respectively underlie the select gate hard masks 208, the erase gate electrode 144 underlies the erase gate hard mask 212, and the dummy select gate electrode 120 underlies the dummy select gate hard mask 206.

As illustrated by the cross-sectional view 1900 of FIG. 19, a first hard mask ARC 1902 is formed covering the structure of FIG. 18. Further, the first hard mask ARC 1902 may, for example, be formed with a top surface that is planar or substantially planar. In some embodiments, a process for forming the first hard mask ARC 1902 comprises depositing the first hard mask ARC 1902, and subsequently performing a planarization into the top surface of first hard mask ARC 1902. The first hard mask ARC 1902 may be deposited by, for example, CVD, PVD, or some other suitable deposition process(es). The planarization may, for example, be performed by a CMP or some other suitable planarization process(es).

As illustrated by the cross-sectional view 2000 of FIG. 20, an etch is performed into the first hard mask ARC 1902, the control gate hard masks 210, the erase gate hard mask 212, the select gate hard masks 208, the dummy select gate hard mask 206, and the control gate hard mask layer 708 to partially remove the first hard mask ARC 1902, the hard masks 210, 212, 208, 206, and the control gate hard mask layer 708. For example, nitride or some other suitable dielectric(s) may be removed from the first hard mask ARC 1902, the hard masks 210, 212, 208, 206, and the control gate hard mask layer 708. In some embodiments, the etch is performed with an etchant that has the same or substantially the same etch rate for the first hard mask ARC 1902 as for the hard masks 210, 212, 208, 206 and the control gate hard mask layer 708. As such, a top surface of the first hard mask ARC 1902, top surfaces of the hard masks 210, 212, 208, 206, and a top surface of the control gate hard mask layer 708 are etched back together once the first hard mask ARC 1902 is sufficiently etched to expose the hard masks 210, 212, 208, 206 and the control gate hard mask layer 708. Further, in some embodiments, the first hard mask ARC 1902 is removed after the etch by, for example, another etching process or some other suitable removal process(es).

As illustrated by the cross-sectional view 2100 of FIG. 21, a dummy liner layer 302 is formed covering the structure of FIG. 20, and a first dummy capping layer 2104 is formed covering the dummy liner layer 302. In some embodiments, the dummy liner layer 302 is formed of silicon oxide or some other suitable dielectric(s). Further, in some embodiments, the first dummy capping layer 2104 is formed of polysilicon or some other suitable material(s). The dummy liner layer 302 and/or the first dummy capping layer 2104 may, for example, be formed conformally. Further, the dummy liner layer 302 and/or the first dummy capping layer 2104 may, for example, be formed by CVD, PVD, some other suitable deposition process(es), or any combination of the foregoing.

Also illustrated by the cross-sectional view 2100 of FIG. 21, a dummy ARC 2106 is formed covering the first dummy capping layer 2104. Further, the dummy ARC 2106 may, for example, be formed with a top surface that is planar or substantially planar. In some embodiments, a process for forming the dummy ARC 2106 comprises depositing the dummy ARC 2106, and subsequently performing a planarization into the top surface of dummy ARC 2106. The dummy ARC 2106 may be deposited by, for example, CVD, PVD, or some other suitable deposition process(es). The planarization may, for example, be performed by a CMP or some other suitable planarization process(es).

As illustrated by the cross-sectional view 2200 of FIG. 22, an etch is performed into the first dummy capping layer 2104 and the dummy ARC 2106 (see FIG. 21) until the dummy ARC 2106 is removed. The etch is performed with an etchant that has the same or substantially the same etch rate for the dummy ARC 2106 as for the first dummy capping layer 2104. As such, a top surface of the dummy ARC 2106 and a top surface of the first dummy capping layer 2104 are etched back together once the dummy ARC 2106 is sufficiently etched to expose the first dummy capping layer 2104. Further, the etch smooths the top surface of the first dummy capping layer 2104.

Figure 23:
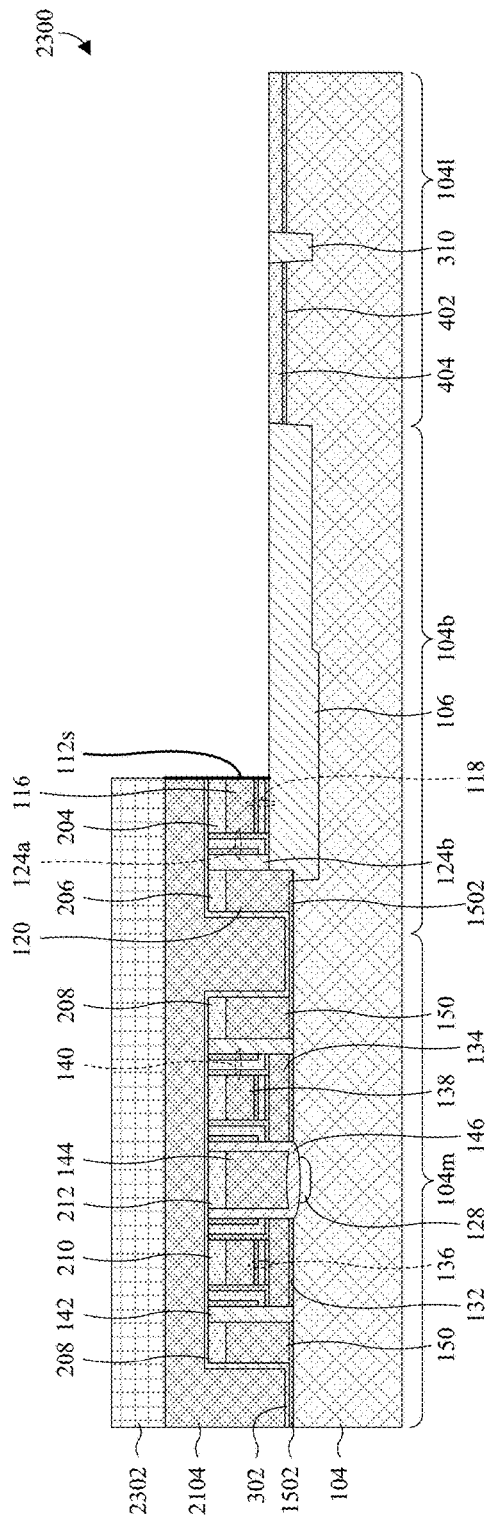

As illustrated by the cross-sectional view 2300 of FIG. 23, an etch is performed into the dummy liner layer 302, the first dummy capping layer 2104, and the multilayer memory film 702 (see FIG. 22). The etch forms a dummy control gate dielectric layer 118, a dummy control gate electrode 116 overlying the dummy control gate dielectric layer 118, and a dummy control gate hard mask 204 overlying the dummy control gate electrode 116. Collectively, the dummy control gate dielectric layer 118, the dummy control gate electrode 116, the dummy control gate hard mask 204, the dummy liner layer 302, and the first dummy capping layer 2104 define a dummy sidewall 112s that overlies the boundary isolation structure 106 and that faces the logic region 104l. The dummy sidewall 112s is heterogeneous (e.g., multiple materials), and is vertical or substantially vertical. Further, the dummy sidewall 112s is smooth or substantially smooth. In some embodiments, the etch is performed by forming and patterning a photoresist layer 2302 covering the memory region 104m and part of the boundary isolation structure 106. An etchant is then applied to the dummy liner layer 302, the first dummy capping layer 2104, and the multilayer memory film 702 with the photoresist layer 2302 in place until the etchant reaches the boundary isolation structure 106, and the photoresist layer 2302 is thereafter stripped.

Figure 24:
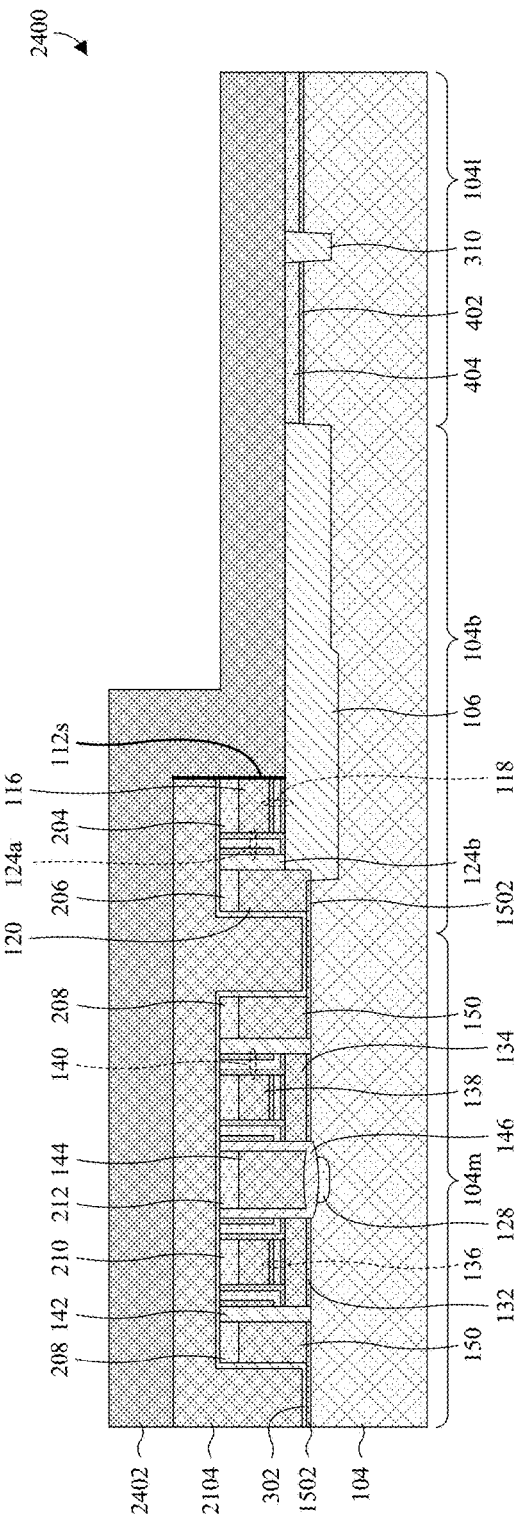

As illustrated by the cross-sectional view 2400 of FIG. 24, a boundary sidewall spacer layer 2402 is formed covering the first dummy capping layer 2104, the boundary isolation structure 106, and the logic region 104l, and is further formed lining the dummy sidewall 112s. In some embodiments, the boundary sidewall spacer layer 2402 is formed of polysilicon, amorphous silicon, metal, a metal nitride, a dielectric, the same material as the first dummy capping layer 2104, a different material than the upper pad layer 404, or some other suitable material(s). For example, the boundary sidewall spacer layer 2402 may be formed of tungsten, aluminum copper, tantalum, tantalum nitride, or some other suitable metal(s) or metal nitride(s). As another example, the boundary sidewall spacer layer 2402 may be formed of oxide, silicon nitride, silicon oxynitride, or some other suitable dielectric(s). The boundary sidewall spacer layer 2402 may, for example, be formed conformally, and/or may, for example, be formed by CVD, PVD, some other suitable deposition process(es), or any combination of the foregoing.

Figure 25:
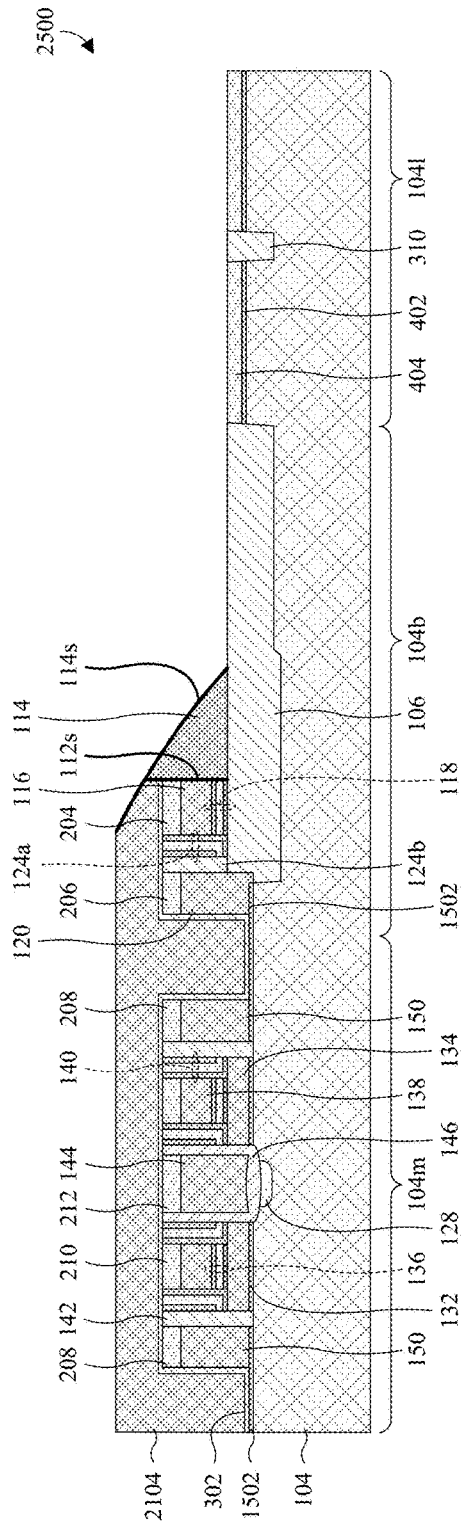

As illustrated by the cross-sectional view 2500 of FIG. 25, an etch is performed into the boundary sidewall spacer layer 2402 (see FIG. 24) to remove horizontal segments of the boundary sidewall spacer layer 2402, without removing vertical segments of the boundary sidewall spacer layer 2402, thereby forming a boundary sidewall spacer 114 on the dummy sidewall 112s. In some embodiments, the boundary sidewall spacer 114 has a triangular profile or some other suitable profile. The boundary sidewall spacer 114 and the first dummy capping layer 2104 collectively define a boundary sidewall 114s that overlies the boundary isolation structure 106 and that faces the logic region 104l. In some embodiments, a portion of the boundary sidewall 114s defined by the first dummy capping layer 2104 is continuous with a portion of the boundary sidewall 114s defined by the boundary sidewall spacer 114. Further, the boundary sidewall 114s is smooth or substantially smooth, and is slanted downward towards the logic region 104l. In some embodiments, the boundary sidewall 114s arcs continuously from a top surface of the first dummy capping layer 2104 to a bottom surface of the boundary sidewall spacer 114. The etch may, for example, be performed by a dry etch or some other suitable etch process(es). The dry etch may, for example, use a halogen chemistry, a fluorine chemistry, some other suitable chemistry, or some other suitable chemistries. The halogen chemistry may, for example, include chlorine (e.g., $Cl_2$), hydrogen bromide (e.g., HBr), oxygen (e.g., $O_2$), argon, some other suitable halogen(s), or any combination of the foregoing. The fluorine chemistry may, for example, include tetrafluoromethane (e.g., $CF_4$), fluoroform (e.g., $CHF_3$), difluoromethane (e.g., $CH_2F_2$), sulfur hexafluoride (e.g., $SF_6$), hexafluoroethane (e.g., $C_2F_6$), hexafluoropropylene (e.g., $C_3F_6$), octafluorocyclobutane (e.g., $C_4F_8$), perfluorocyclopentene ($C_5F_8$), some other suitable fluorine(s), or any combination of the foregoing.

Figure 26:
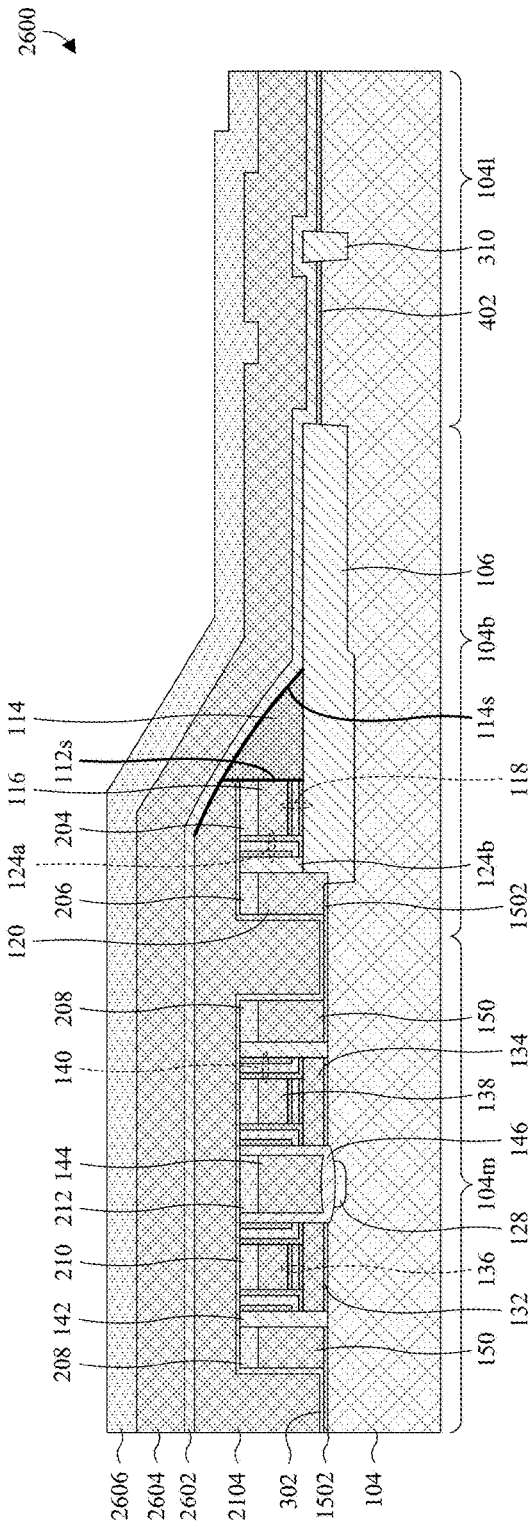

As illustrated by the cross-sectional view 2600 of FIG. 26, an etch is performed into the upper pad layer 404 (see FIG. 25) to remove the upper pad layer 404 from the logic region 104*l*. In some embodiments, the etch results in a logic recesses with sidewalls defined by the boundary and logic isolation structures 106, 310. In some embodiments, the etch is performed with an etchant that has a high etch rate for the upper pad layer 404 relative to the boundary sidewall spacer 114 and the first dummy capping layer 2104, such that the boundary sidewall spacer 114 and the first dummy capping layer 2104 serve as a mask for the etch.

Absent the boundary sidewall spacer 114, the etch into the upper pad layer 404 may cause lateral undercutting, divots, and the like to form along the dummy sidewall 112*s*. For example, the dummy sidewall 112*s* may be heterogeneous (e.g., multiple materials) and comprise the same material (e.g., silicon nitride) as the upper pad layer 404, whereby the etchant used to remove the upper pad layer 404 may also partially remove a portion of the dummy sidewall 112*s*. Further, the boundary sidewall spacer 114 provides a smooth boundary sidewall 114*s* that remains smooth after the etch. For example, the boundary sidewall 114*s* may be a material for which the etchant used to remove the upper pad layer 404 has a low or negligible etch rate. As another example, the boundary sidewall 114*s* may be homogenous (e.g., a single material), such that etching to the boundary sidewall 114*s* is uniform or substantially uniform across the boundary sidewall 114*s*. Since the boundary sidewall 114*s* remains smooth after the etch, the boundary sidewall 114*s* does not trap etch residue (e.g., high κ etch residue) generated during subsequent processing and facilitates complete removal of the etch residue.

Also illustrated by the cross-sectional view 2600 of FIG. 26, a logic dielectric layer 2602 is formed covering and lining the structure of FIG. 25. Further, a logic gate layer 2604 is formed covering the logic dielectric layer 2602, and a logic hard mask layer 2606 is formed covering the logic gate layer 2604. The logic dielectric layer 2602 may, for example, be formed of oxide, a high κ dielectric, some other suitable dielectric(s), or any combination of the foregoing. The logic gate layer 2604 may, for example, be formed of doped or undoped polysilicon, metal, some conductive material, or some other suitable material(s). The logic hard mask layer 2606 may, for example, be formed of silicon nitride, silicon oxide, some other suitable dielectric(s), or any combination of the foregoing. In some embodiments, the logic dielectric layer 2602, the logic gate layer 2604, and the logic hard mask layer 2606 are formed conformally, and/or are formed by CVD, PVD, electroless plating, electroplating, some other suitable growth or deposition process(es), or any combination of the foregoing.

Figure 27:
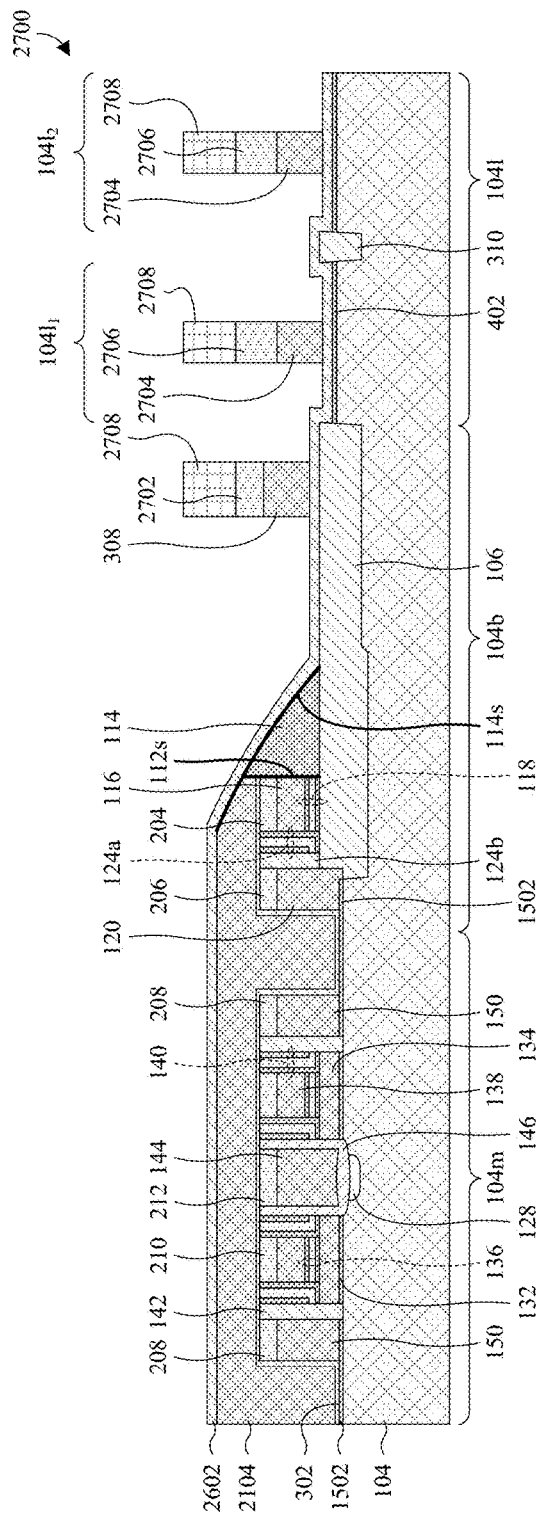

As illustrated by the cross-sectional view 2700 of FIG. 27, an etch is performed into the logic hard mask layer 2606 (see FIG. 26) and the logic gate layer 2604 (see FIG. 26) to form a dummy logic gate electrode 308 and a dummy logic gate hard mask 2702. The dummy logic gate electrode 308 overlies the boundary isolation structure 106, laterally between the boundary sidewall spacer 114 and the logic region 104*l*, and the dummy logic gate hard mask 2702 overlies the dummy logic gate electrode 308. Additionally, the etch forms a pair of sacrificial logic gate electrodes 2704 and a pair of logic gate hard masks 2706. The sacrificial logic gate electrodes 2704 respectively overlie the first and second logic regions 104*l*$_1$, 104*l*$_2$, and the logic gate hard masks 2706 respectively overlie the sacrificial logic gate electrodes 2704. In some embodiments, the etch is performed by forming and patterning a photoresist layer 2708 covering the logic hard mask layer 2606 with a layout of the dummy logic gate hard mask 2702 and the logic gate hard masks 2706. An etchant is then applied to the logic hard mask layer 2606 and the logic gate layer 2604 with the photoresist layer 2708 in place until the etchant reaches the logic dielectric layer 2602, and the photoresist layer 2708 is thereafter stripped.

Figure 28:
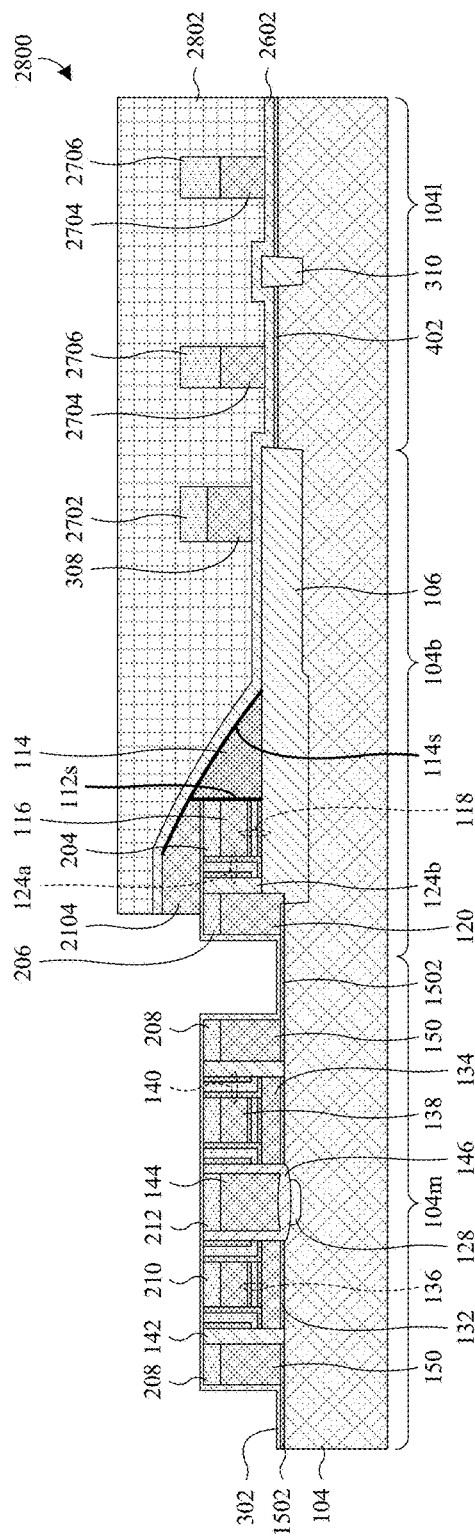

As illustrated by the cross-sectional view 2800 of FIG. 28, an etch is performed into the logic dielectric layer 2602 and the first dummy capping layer 2104 to remove the logic dielectric layer 2602 and the first dummy capping layer 2104 from the memory region 104*m*. In some embodiments, the etch is performed by forming and patterning a photoresist layer 2802 covering the logic region 104*l* and the boundary isolation structure 106, but not the memory region 104*m*. An etchant is then applied to the logic dielectric layer 2602 and the first dummy capping layer 2104 with the photoresist layer 2802 in place until the etchant reaches dummy liner layer 302, and the photoresist layer 2802 is thereafter stripped. The dummy liner layer 302 may, for example, serve as an etch stop for the etch.

Figure 29:
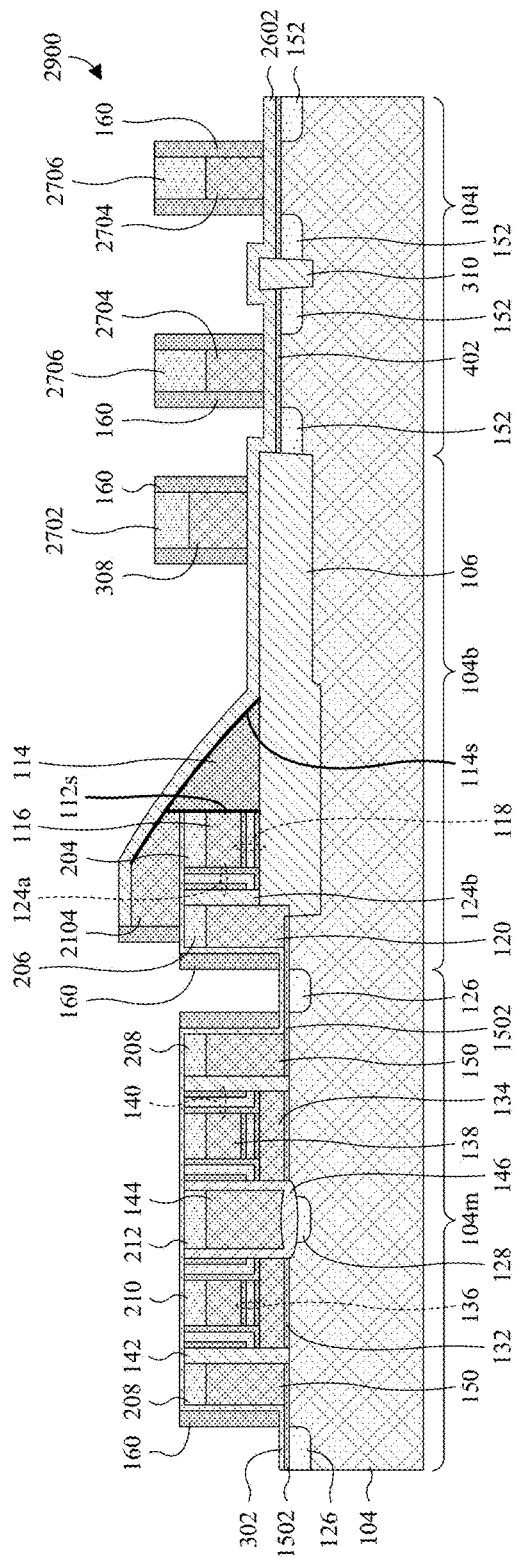

As illustrated by the cross-sectional view 2900 of FIG. 29, main sidewall spacers 160 are formed along sidewalls of the select gate electrodes 150, a sidewall of the dummy select gate electrode 120, a sidewall of the first dummy capping layer 2104, sidewalls of the dummy logic gate electrode 308, and sidewalls of the sacrificial logic gate electrodes 2704. For ease of illustration, only some of the main sidewall spacers 160 are labeled 160. In some embodiments, the main sidewall spacers 160 each comprise silicon oxide, silicon nitride, some other suitable dielectric(s), or any combination of the foregoing. Further, in some embodiments, a process for forming the main sidewall spacers 160 comprises depositing a main sidewall spacer layer covering and lining the structure of FIG. 28. An etch back is then performed into the main sidewall spacer layer to remove horizontal segments of the main sidewall spacer layer without removing vertical segments of the main sidewall spacer layer. The main sidewall spacer layer may, for example, be deposited conformally, and/or may, for example, be formed by CVD, PVD, some other suitable deposition process(es), or any combination of the foregoing.

Also illustrated by the cross-sectional view 2900 of FIG. 29, individual memory source/drain regions 126 are formed in the memory region 104*m*, respectively bordering the select gate electrodes 150. Further, logic source/drain regions 152 are formed in pairs in the logic region 104*l*, with the source/drain regions of each pair respectively bordering opposite sidewalls of a sacrificial logic gate electrode 2704. In some embodiments, a process for forming the individual memory source/drain regions 126 and the logic source/drain regions 152 comprises ion implantation into the semiconductor substrate 104. Dopants and/or implant energy may, for example, be selected so as to perform the ion implantation through the dummy liner layer 302, the memory dielectric layer 1502, the logic dielectric layer 2602, and the lower pad layer 402. In other embodiments, some process other than ion implantation is used to form the individual memory source/drain regions 126 and the logic source/drain regions 152.

Figure 30:
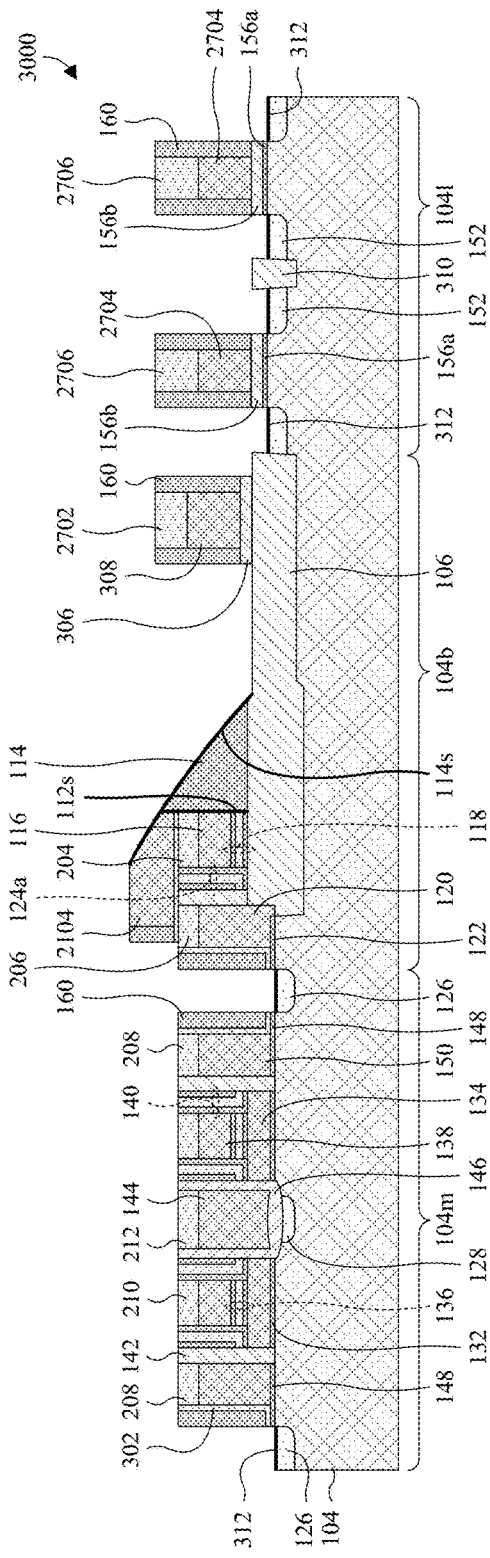

As illustrated by the cross-sectional view 3000 of FIG. 30, an etch is performed into the dummy liner layer 302 (see FIG. 29), the memory dielectric layer 1502 (see FIG. 29), the logic dielectric layer 2602 (see FIG. 29), and the lower pad layer 402 (see FIG. 29) to remove these layers from the individual memory source/drain regions 126 and the logic source/drain regions 152, thereby exposing the individual memory source/drain regions 126 and the logic source/drain regions 152. Further, the etch forms a pair of select gate dielectric layers 148, a dummy select gate dielectric layer 122, a dummy logic gate dielectric layer 306, a pair of first logic gate dielectric layers 156a, and a pair of second logic gate dielectric layers 156b. The select gate dielectric layers 148 are formed from the memory dielectric layer 1502 and respectively underlie the select gate electrodes 150. The dummy select gate dielectric layer 122 is formed from the memory dielectric layer 1502 and underlies the dummy select gate electrode 120. The dummy logic gate dielectric layer 306 is formed from the logic dielectric layer 2602 and underlies the dummy logic gate electrode 308. The first logic gate dielectric layers 156a are formed from the lower pad layer 402 and respectively underlie the sacrificial logic gate electrodes 2704. The second logic gate dielectric layers 156b are formed from the logic dielectric layer 2602 and respectively underlie the sacrificial logic gate electrodes 2704 over the first logic gate dielectric layers 156a. In some embodiments, a process for performing the etch comprises applying an etchant to the dummy liner layer 302, the memory dielectric layer 1502, the logic dielectric layer 2602, and the lower pad layer 402, and thereafter applying a cleaning solution or mixture to remove residual etch residue. The cleaning solution or mixture may be or otherwise comprise, for example, a sulfuric acid hydrogen peroxide mixture (SPM) or some other suitable cleaning solution(s) or mixture(s). Further, in some embodiments, the etch is performed using, inter alia, the select and control gate hard masks 208, 210, the logic gate hard masks 2706, and the first dummy capping layer 2104 as a mask.

During the etch, the boundary sidewall spacer 114 provides a smooth boundary sidewall 114s devoid of defects. As such, the boundary sidewall 114s is not subject to trapping etch residue (e.g., etch residue generated while etching the logic dielectric layer 2602) and, hence, facilitates complete removal of etch residue. By facilitating complete removal of etch residue, the boundary sidewall spacer 114 may increase yield and the reliability of semiconductor devices (e.g., logic or memory devices) on the semiconductor substrate 104. For example, the logic dielectric layer 2602 may comprise a high κ dielectric, whereby the etch may produce high κ etch residue. Residual high κ etch residue may diffuse into the semiconductor substrate 104 and shift doping profiles of the semiconductor substrate 104 to change parameters of the semiconductor devices. Also, residual high κ etch residue may contaminate process tools used in subsequent processing steps, and similarly affect ICs (e.g., affect doping profiles of the ICs) processed on the contaminated process tools.

Also illustrated by the cross-sectional view 3000 of FIG. 30, silicide pads 312 are formed on the individual memory source/drain regions 126 and the logic source/drain regions 152. For ease of illustration, only some of the silicide pads 312 are labeled 312. The silicide pads 312 may be or otherwise comprise, for example, nickel silicide or some other suitable silicide(s), and/or may, for example, be formed by a salicide process, or some other suitable growth process(es).

As illustrated by the cross-sectional view 3100 of FIG. 31, a second hard mask ARC 3102 is formed covering the structure of FIG. 30. Further, the second hard mask ARC 3102 may, for example, be formed with a top surface that is planar or substantially planar. In some embodiments, a process for forming the second hard mask ARC 3102 comprises depositing the second hard mask ARC 3102, and subsequently performing a planarization into the top surface of the second hard mask ARC 3102. The second hard mask ARC 3102 may, for example, be deposited by CVD, PVD, or some other suitable deposition process(es), and/or the planarization may, for example, be performed by a CMP or some other suitable planarization process(es).

As illustrated by the cross-sectional view 3200 of FIG. 32, an etch is performed into, inter alia, the second hard mask ARC 3102, the control, select, erase, and logic gate hard masks 210, 208, 212, 2706 (see FIG. 31), the dummy control, select, and logic gate hard masks 204, 206, 2702 (see FIG. 31), and the first dummy capping layer 2104 (see FIG. 31) to remove the hard masks and the first dummy capping layer 2104. In some embodiments, the etch is performed with an etchant that has the same or substantially the same etch rate for the second hard mask ARC 3102 as for the hard masks and the first dummy capping layer 2104. As such, the top surface of the second hard mask ARC 3102, the top surface of the first dummy capping layer 2104, and the top surfaces of the hard masks are etched back together once the second hard mask ARC 3102 is sufficiently etched to expose the hard masks and the first dummy capping layer 2104.

Figure 33:
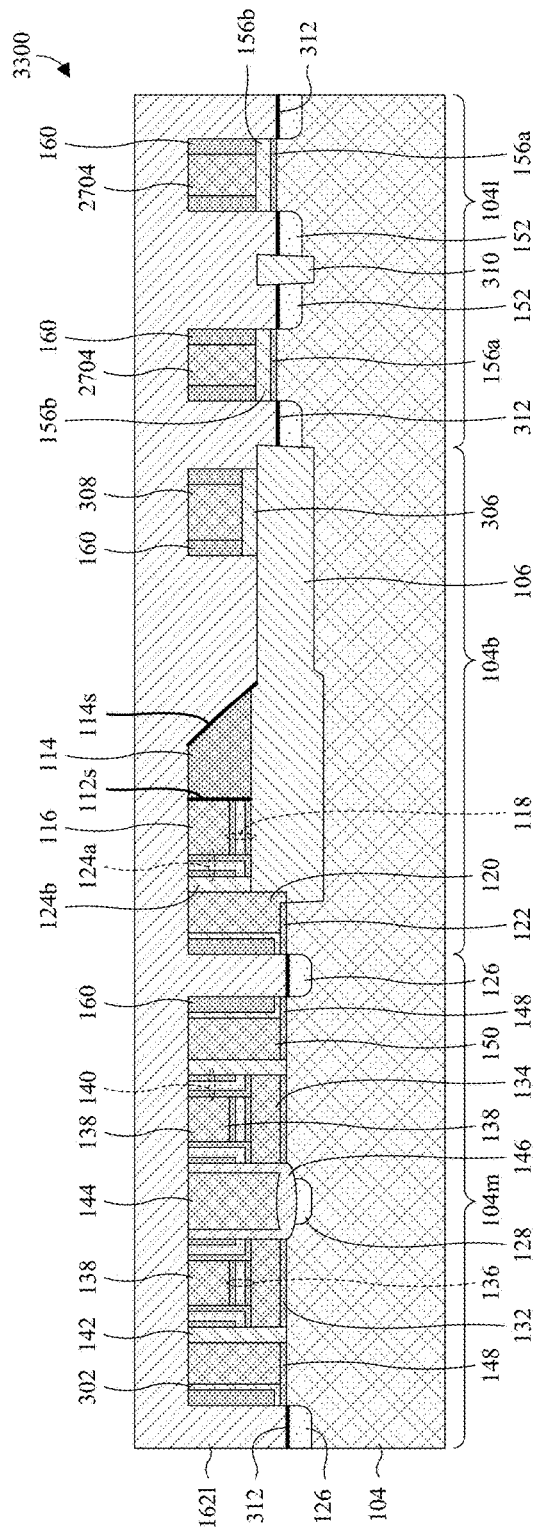

As illustrated by the cross-sectional view 3300 of FIG. 33, the second hard mask ARC 3102 (see FIG. 32) is removed, and thereafter a lower ILD layer 162l is formed in place of the second hard mask ARC 3102. Further, the lower ILD layer 162l is formed covering the structure of FIG. 32 and, in some embodiments, with a top surface that is planar or substantially planar. The lower ILD layer 162l may, for example, be oxide, a low κ dielectric, some other suitable dielectric(s), or any combination of the foregoing. The second hard mask ARC 3102 may, for example, be removed by an etching process or some other suitable removal process(es). In some embodiments, a process for forming the lower ILD layer 162l comprises depositing the lower ILD layer 162l, and subsequently performing a planarization into the top surface of the lower ILD layer 162l. The lower ILD layer 162l may, for example, be deposited by CVD, PVD, sputtering, or any combination of the foregoing. The planarization may, for example, be performed by a CMP or some other suitable planarization process(es).

Figure 34:
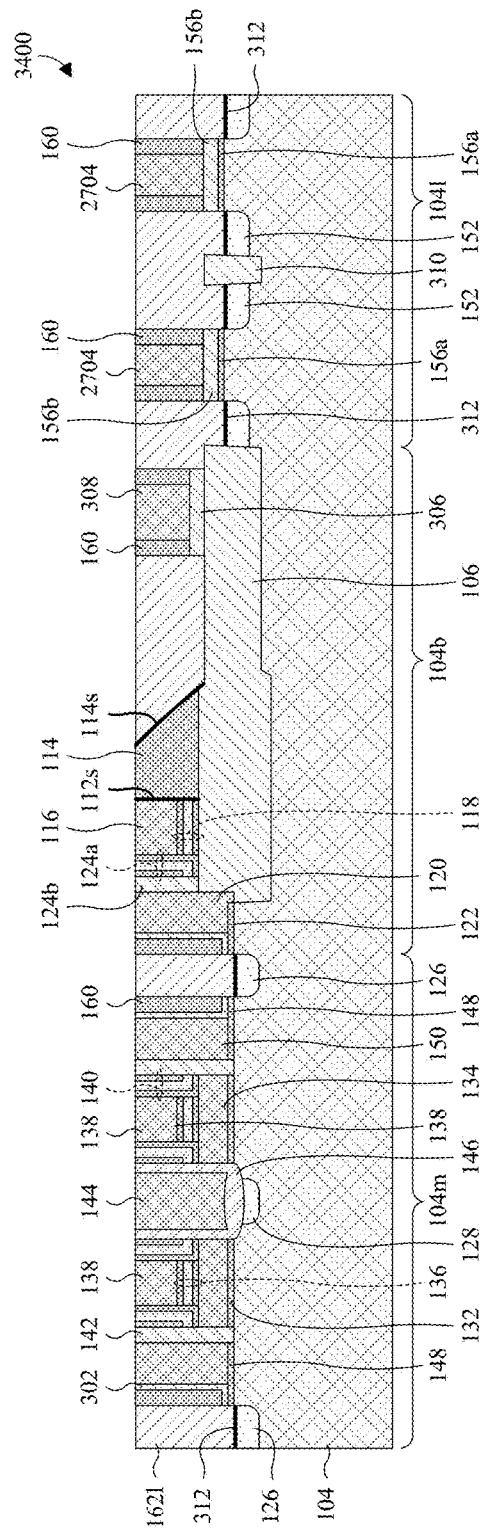

As illustrated by the cross-sectional view 3400 of FIG. 34, a planarization is performed into the lower ILD layer 162l to recess a top surface of the lower ILD layer 162l to about even with top surfaces of the sacrificial logic gate electrodes 2704, thereby exposing the sacrificial logic gate electrodes 2704. The planarization may, for example, be performed by a CMP or some other suitable planarization process(es).

Figure 35:
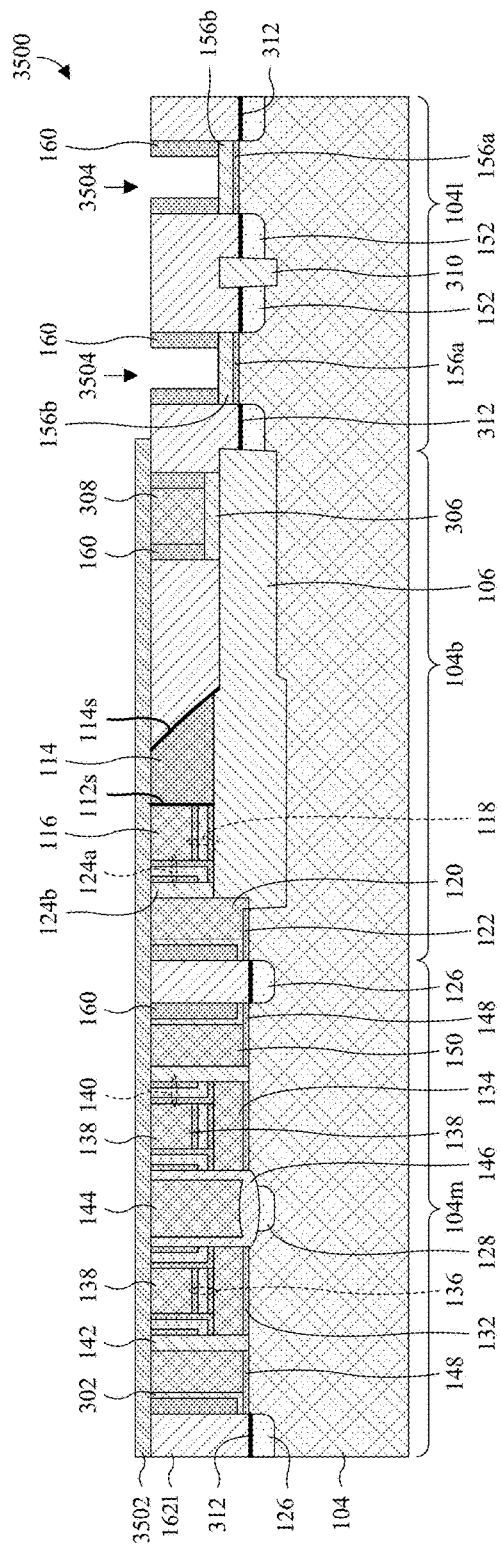

As illustrated by the cross-sectional view 3500 of FIG. 35, a second dummy capping layer 3502 is formed covering the memory region 104m and the boundary isolation structure 106, but not the logic region 104l. The second dummy capping layer 3502 may, for example, be oxide, nitride, some other suitable dielectric(s), or any combination of the foregoing. In some embodiments, a process for forming the second dummy capping layer 3502 comprises depositing the second dummy capping layer 3502 by CVD, PVD, or some other suitable deposition process(es), and subsequently patterning the second dummy capping layer 3502 layer by, for example, photolithography and an etching process, or by some other suitable patterning process(es).

Also illustrated by the cross-sectional view 3500 of FIG. 35, an etch is performed into the sacrificial logic gate electrodes 2704 (see FIG. 34) to remove the sacrificial logic gate electrodes 2704 and to define logic openings 3504 in place of the sacrificial logic gate electrodes 2704. In some embodiments, a process for performing the etch comprises applying an etchant to the sacrificial logic gate electrodes 2704 with the second dummy capping layer 3502 in place until the sacrificial logic gate electrodes 2704 is removed. The second dummy capping layer 3502 and other dielectric structure (e.g., the lower ILD layer 162*l*) may serve as a mask while the etchant is being applied.

Figure 36:
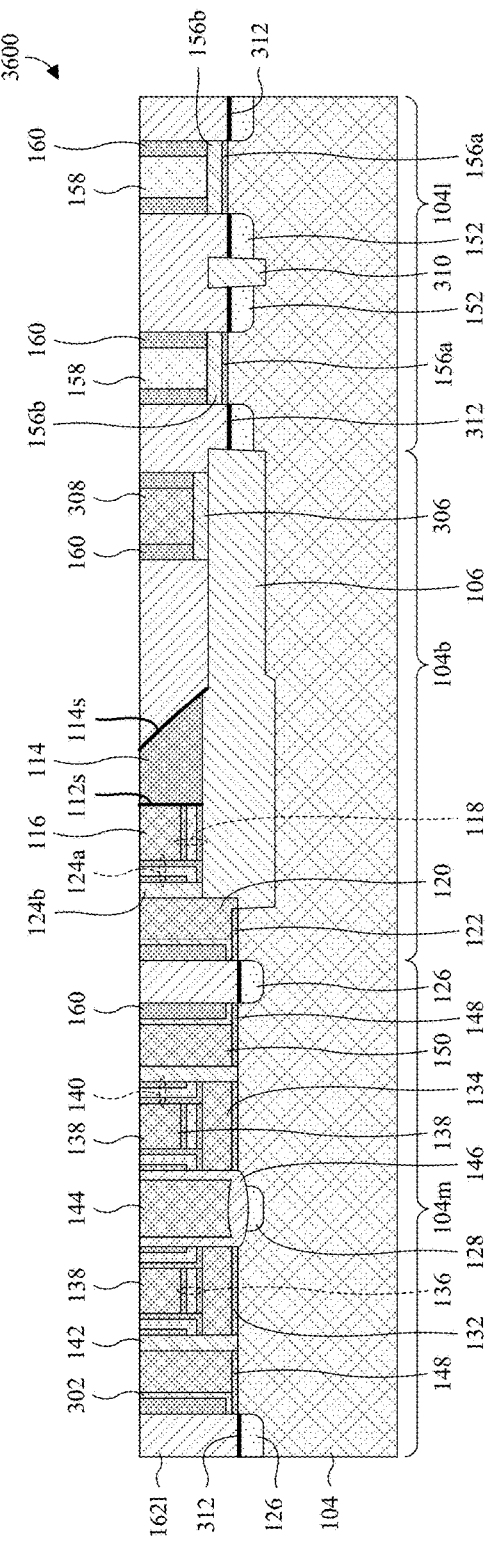

As illustrated by the cross-sectional view 3600 of FIG. 36, logic gate electrodes 158 are formed in the logic openings 3504 (see FIG. 35). The logic gate electrodes 158 may, for example, be metal, doped polysilicon, a different material than the sacrificial logic gate electrodes 2704, or some other suitable conductive material(s). In some embodiments, a process for forming the logic gate electrodes 158 comprises forming a conductive layer covering the second dummy capping layer 3502 (see FIG. 35), and further filling the logic openings 3504. The conductive layer may be formed by, for example, by CVD, PVD, electroless plating, electroplating, or some other suitable growth or deposition process(es). A planarization is then performed into the conductive layer and the second dummy capping layer 3502 until the lower ILD layer 162*l* is reached and second dummy capping layer 3502 is removed. The planarization may, for example, be performed by a CMP or some other suitable planarization process(es).

Figure 37:
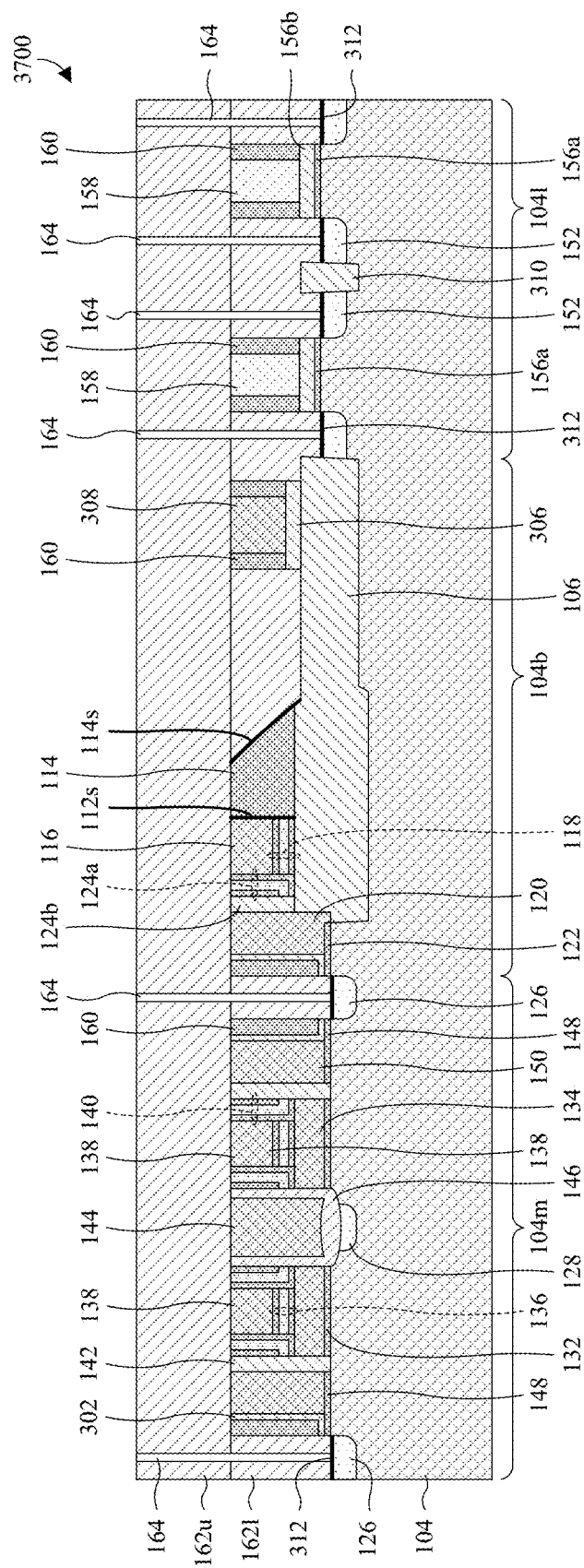

As illustrated by the cross-sectional view 3700 of FIG. 37, an upper ILD layer 162*u* is formed covering the structure of FIG. 36 and with a top surface that is planar or substantially planar. The upper ILD layer 162*u* may, for example, be oxide, a low κ dielectric, some other suitable dielectric(s), or any combination of the foregoing. Further, the upper ILD layer 162*u* may, for example, be formed by depositing the upper ILD layer 162*u*, and subsequently performing a planarization into the top surface of the upper ILD layer 162*u*. The deposition may, for example, be performed by CVD, PVD, sputtering, or any combination of the foregoing. The planarization may, for example, be performed by a CMP or some other suitable planarization process(es).

Also illustrated by the cross-sectional view 3700 of FIG. 37, contact vias 164 are formed extending through the upper ILD layer 162*u* and the lower ILD layer 162*l* to the individual memory source/drain regions 126, the logic source/drain regions 152, the common memory source/drain region 128, the control gate electrodes 138, the select gate electrodes 150, the erase gate electrode 144, the logic gate electrodes 158, or any combination of the foregoing.

Figure 38:
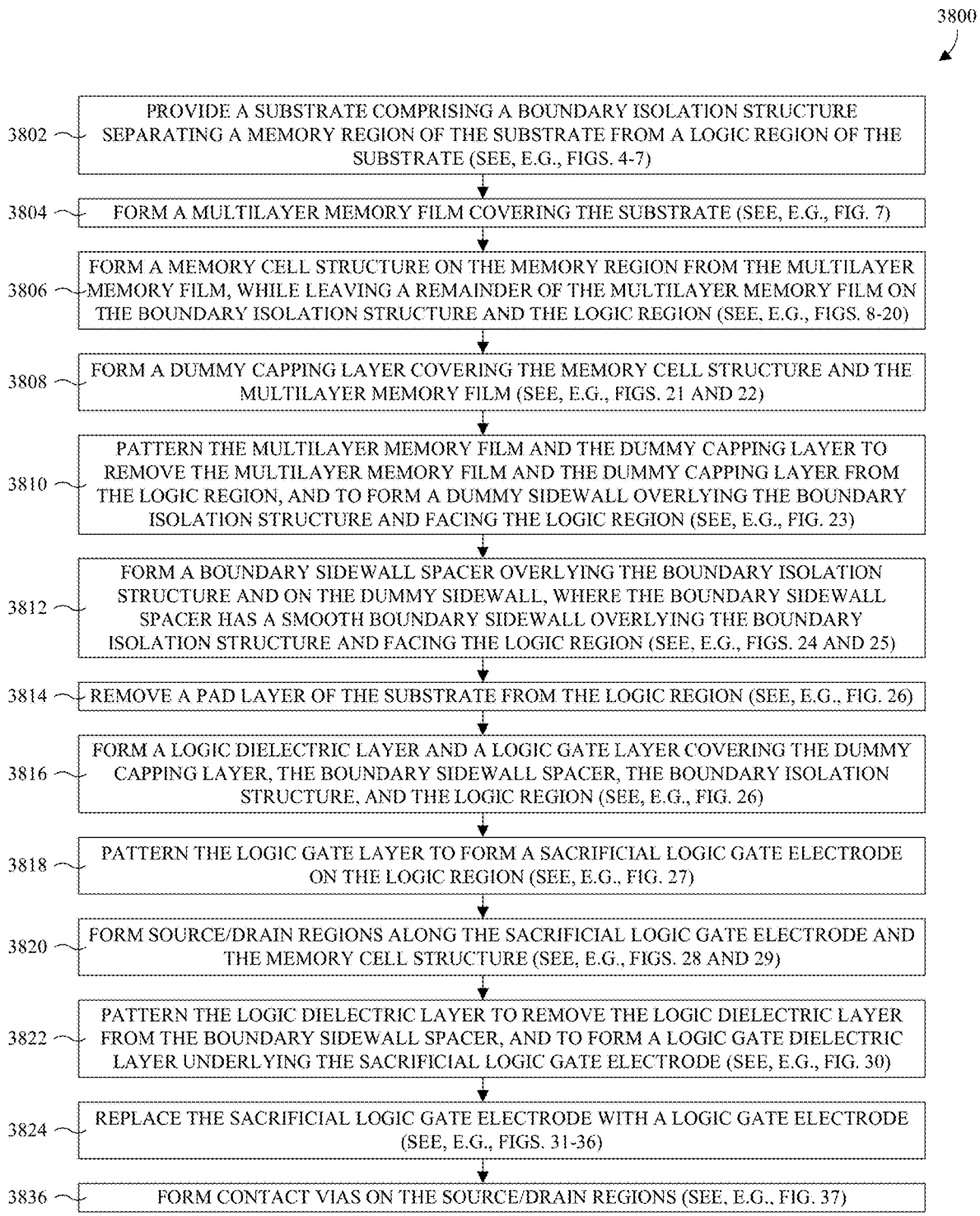
FIG. 38 illustrates a flowchart of some embodiments of the method of FIGS. 4-37.

With reference to FIG. 38, a flowchart 3800 of some embodiments of a method for forming an IC comprising an embedded memory boundary structure with a boundary sidewall spacer is provided. The IC may, for example, correspond to the IC of FIGS. 4-37.

At 3802, a substrate is provided. The substrate comprises a boundary isolation structure separating a memory region of the substrate from a logic region of the substrate. See, for example, FIGS. 4-7.

At 3804, a multilayer memory film is formed covering the substrate. See, for example, FIG. 7.

At 3806, a memory cell structure is formed on the memory region from the multilayer memory film, while leaving a remainder of the multilayer memory film on the boundary isolation structure and the logic region. See, for example, FIGS. 8-20.

At 3808, a dummy capping layer is formed covering the memory cell structure and the multilayer memory film. See, for example, FIGS. 21 and 22.

At 3810, the multilayer memory film and the dummy capping layer are patterned to remove the multilayer memory film and the dummy capping layer from the logic region, and to form a dummy sidewall overlying the boundary isolation structure and facing the logic region. The dummy sidewall is collectively defined by a remainder of the multilayer memory film and a remainder of the dummy capping layer. See, for example, FIG. 23.

At 3812, a boundary sidewall spacer is formed overlying the boundary isolation structure and on the dummy sidewall. The boundary sidewall spacer has a smooth boundary sidewall overlying the boundary isolation structure and facing the logic region. See, for example, FIGS. 24 and 25.

At 3814, a pad layer of the substrate is removed from the logic region. See, for example, FIG. 26. The boundary sidewall remains smooth after removing pad layer due to a composition of the boundary sidewall (see above for more details).

At 3816, a logic dielectric layer and a logic gate layer are formed covering the dummy capping layer, the boundary sidewall spacer, the boundary isolation structure, and the logic region. See, for example, FIG. 26.

At 3818, the logic gate layer is patterned to form a sacrificial logic gate electrode on the logic region. See, for example, FIG. 27.

At 3820, source/drain regions are formed along sidewalls of the sacrificial logic gate electrode and sidewalls of the memory cell structure. See, for example, FIGS. 28 and 29.

At 3822, the logic dielectric layer is patterned to remove the logic dielectric layer from the boundary sidewall spacer, and to further form a logic gate dielectric layer underlying the sacrificial logic gate electrode. See, for example, FIG. 30. The patterning may, for example, be performed by an etch or some other suitable patterning process(es).

Because the boundary sidewall is smooth, the boundary sidewall facilitates complete removal of residue (e.g., etch residue) generated while patterning the logic dielectric layer. This may, in turn, increase yield and the reliability of semiconductor devices on the substrate. For example, the logic dielectric layer may comprise a high κ dielectric, whereby the patterning may produce high κ etch residue. Absent complete removal of the high κ etch residue, residual high κ etch residue may diffuse into the substrate and shift doping profiles of the substrate to change parameters of the semiconductor devices.

At 3824, the sacrificial logic gate electrode is replaced with a logic gate electrode. For example, the sacrificial logic gate electrode may be replaced with a metal logic gate electrode when the logic dielectric layer comprises a high κ dielectric. See, for example, FIGS. 31-36.

At 3836, contact vias are formed on the source/drain regions. See, for example, FIG. 37.

While the flowchart 3800 of FIG. 38 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards a method including: forming an isolation structure in a semiconductor substrate, wherein the isolation structure separates a memory region of the semiconductor substrate from a logic region of the semiconductor substrate; forming a multilayer film covering the isolation structure, the memory region, and the logic region; forming a memory cell structure on the memory region, wherein the memory cell structure is formed from the multilayer film; forming a dummy capping layer covering the memory cell structure and a remainder of the multilayer film; performing a first etch into the multilayer film and the dummy capping layer to remove the multilayer film and the dummy capping layer from the logic region, such that the multilayer film and the dummy capping layer define a dummy sidewall on the isolation structure; forming a sidewall spacer layer covering the dummy capping layer, the isolation structure, and the logic region, and further lining the dummy sidewall; performing a second etch into the sidewall spacer layer to remove horizontal segments of the sidewall spacer layer, and to form a sidewall spacer on dummy sidewall; and forming a logic device structure on the logic region after forming the sidewall spacer. In an embodiment, the dummy capping layer and the sidewall spacer collectively define a boundary sidewall overlying the isolation structure and facing the logic region, wherein the boundary sidewall is slanted, and wherein a portion of the boundary sidewall defined by the dummy capping layer is continuous with a portion of the boundary sidewall defined by the sidewall spacer. In an embodiment, the sidewall spacer at least partially defines a boundary sidewall overlying the isolation structure and facing the logic region, wherein the boundary sidewall is homogenous, and wherein the dummy sidewall is heterogenous. In an embodiment, the multilayer film includes an ONO film, a polysilicon layer overlying the ONO film, and a nitride layer overlying the polysilicon layer, such that the dummy sidewall is defined in part by the ONO film, the polysilicon layer, and the nitride layer. In an embodiment, the sidewall spacer has a triangular profile upon completion of the second etch. In an embodiment, the dummy sidewall is vertical or substantially vertical, wherein the dummy sidewall is in direct contact with the sidewall spacer. In an embodiment, the method further includes: forming a pad layer covering the semiconductor substrate; patterning the pad layer with a layout of the isolation structure; performing a third etch into the semiconductor substrate with the pad layer in place to form an isolation trench in the semiconductor substrate; filling the isolation trench with a dielectric material to form the isolation structure; and performing a fourth etch into the pad layer with the sidewall spacer in place to remove the pad layer from the logic region. In an embodiment, the sidewall spacer at least partially defines a boundary sidewall overlying the isolation structure and facing the logic region, wherein the dummy sidewall and the pad layer share a material, and wherein the boundary sidewall is devoid of the material. In an embodiment, the forming of the logic device structure includes: forming a conformal high κ dielectric layer over the dummy capping layer, the sidewall spacer, and the logic region; forming a polysilicon layer over the conformal high κ dielectric layer; and performing a third etch into the conformal high κ dielectric layer and the polysilicon layer to form a polysilicon gate electrode and a high κ gate dielectric layer stacked on the logic region. In an embodiment, the method further includes replacing the polysilicon gate electrode with a metal gate electrode.

Further, some embodiments of the present application are directed towards an IC including: a semiconductor substrate including a peripheral region and a memory cell region separated by an isolation structure, wherein the isolation structure extends into a top surface of the semiconductor substrate and includes dielectric material; a memory cell on the memory region; a dummy control gate structure on the isolation structure, wherein the dummy control gate structure defines a dummy sidewall that faces the peripheral region and that includes multiple different materials; a sidewall spacer on the isolation structure, along the dummy sidewall of the dummy control gate structure, wherein the sidewall spacer has a boundary sidewall that faces the peripheral region and that is smooth; and a logic device on the peripheral region. In an embodiment, the boundary sidewall is continuous and smooth from a topmost surface of the sidewall spacer to a bottommost surface of the sidewall spacer. In an embodiment, the boundary sidewall is slanted downward towards the peripheral region. In an embodiment, the boundary sidewall is at an angle of less than about 80 degrees relative to a bottommost surface of the sidewall spacer. In an embodiment, the dummy sidewall is heterogenous, wherein the boundary sidewall is homogeneous. In an embodiment, the dummy control structure includes an ONO film and a dummy gate electrode overlying the ONO film, wherein the dummy sidewall is smooth and defined at least in part by the ONO film and the dummy gate electrode. In an embodiment, the dummy sidewall is vertical or substantially vertical, wherein the sidewall spacer directly contacts the dummy sidewall, and wherein the dummy sidewall and the boundary sidewall are on opposite sides of the sidewall spacer. In an embodiment, the memory cell further includes: first and second individual source/drain regions in the semiconductor substrate; a common source/drain region in the semiconductor substrate, laterally spaced between the first and second individual source/drain regions, wherein the common source/drain region is separated from the first individual source/drain region by a first channel region, and wherein the common source/drain region is separated from the second individual source/drain region by a second channel region; an erase gate electrode on the common source/drain region; a pair of floating gate electrodes respectively on the first and second channel regions; a pair of control gate electrodes respectively overlying the floating gate electrodes; and a pair of select gate electrodes respectively on the first and second channel regions, and laterally spaced from the common source/drain respectively by the floating gate electrodes. In an embodiment, the logic device includes: a high κ gate dielectric layer; and a metal gate electrode overlying the high κ dielectric layer.

Further, some embodiments of the present application are directed towards another method including: forming an isolation structure in a semiconductor substrate, wherein the isolation structure separates a memory region of the semiconductor substrate from a logic region of the semiconductor substrate, and wherein the isolation structure includes a dielectric material; forming an ONO film covering the semiconductor substrate; forming a doped polysilicon layer covering the ONO film; forming a silicon nitride layer covering the doped polysilicon layer; forming a dummy poly silicon layer covering the silicon nitride layer; forming a mask over the dummy polysilicon layer so an edge of the mask is directly over the isolation structure; performing an etch with the mask in place to remove portions of the dummy polysilicon layer, the silicon nitride layer, the doped polysilicon layer, and the ONO film on the logic region, wherein the dummy poly silicon layer, the silicon nitride layer, the doped poly silicon layer, and the ONO film each have a sidewall overlying the isolation structure and aligned to the edge of the mask after performing the etch; stripping the mask; conformally depositing a sidewall spacer layer covering the dummy polysilicon, the isolation structure, and the logic region, and further lining the sidewall of each of the dummy polysilicon layer, the silicon nitride layer, the doped polysilicon layer, and the ONO film; and performing an etch back into the sidewall spacer layer to remove horizontal segments of the sidewall spacer layer without removing vertical segments of the sidewall spacer layer, wherein a vertical segment of the sidewall spacer layer defines a sidewall spacer adjoining and sealing the sidewall of each of the dummy polysilicon layer, the silicon nitride layer, the doped polysilicon layer, and the ONO film.

Further, some embodiments of the present application are directed towards another IC including: a semiconductor substrate including a logic region and a memory region separated by an isolation structure, wherein the isolation structure extends into a top of the semiconductor substrate and includes dielectric material; a split-gate flash memory cell on the memory region; a dummy control gate structure on the isolation structure, wherein the dummy control gate structure includes an ONO film, a polysilicon layer overlying the ONO film, and a silicon nitride layer overlying the poly silicon layer, and wherein the ONO film, the poly silicon layer, and the silicon nitride layer collectively define a dummy sidewall that faces the logic region and that overlies the isolation structure; a sidewall spacer on the isolation structure, along the dummy sidewall, wherein the sidewall spacer at least partially defines a boundary sidewall that faces the logic region and that is slanted, and wherein the boundary sidewall is continuous from a bottommost surface of the sidewall spacer to a topmost surface of the sidewall spacer; and a logic device on the logic region, wherein the logic device includes a high κ dielectric layer and a metal gate electrode overlying the high κ dielectric layer, and wherein a topmost surface of the metal gate electrode is even with the topmost surface of the sidewall spacer. In an embodiment, the sidewall spacer is polysilicon. In an embodiment, the isolation structure partially defines the boundary sidewall, wherein a portion of the boundary sidewall defined by the isolation structure is continuous with a portion of the boundary sidewall defined by the sidewall spacer.

Further, some embodiments of the present application are directed towards yet another IC including: a semiconductor substrate including a peripheral region and a memory region separated by an isolation structure, wherein the isolation structure includes a dielectric material and extends into a top of the semiconductor substrate; a dummy structure overlying the isolation structure and defining a vertical or substantially vertical sidewall, wherein the vertical or substantially vertical sidewall of the dummy structure faces the peripheral region, overlies the isolation structure, and includes multiple different materials; and a sidewall spacer overlying the isolation structure, wherein the sidewall spacer defines a vertical or substantially vertical sidewall directly contacting the vertical or substantially vertical sidewall of the dummy structure, wherein the sidewall spacer at least partially defines a slanted sidewall facing the peripheral region and overlying the isolation structure, and wherein the slanted sidewall is a single material from a bottom surface of the sidewall spacer to a top edge of the slanted sidewall. In an embodiment, the IC further includes: a memory cell on the memory region of the semiconductor substrate, wherein the memory cell includes a floating gate electrode and a control gate electrode overlying the floating gate electrode, wherein the memory cell further includes a select gate electrode and an erase gate electrode respectively bordering opposite sides of the floating gate electrode. In an embodiment, the IC further includes a logic device on the peripheral region of the semiconductor substrate, wherein the logic device includes a high κ gate dielectric layer and a metal gate electrode overlying the high κ dielectric layer, and wherein a topmost surface of the metal gate electrode is even with the topmost surface of the sidewall spacer. In an embodiment, the dummy structure includes an ONO film and a doped polysilicon layer overlying the ONO film.

In view of the foregoing, some embodiments of the present application are directed towards yet another method including: forming an isolation structure in a semiconductor substrate, wherein the isolation structure demarcates a memory region of the semiconductor substrate and a logic region of the semiconductor substrate; forming a multilayer film covering the isolation structure, the memory region, and the logic region; performing an etch into the multilayer film to remove the multilayer film from the logic region, such that the multilayer film at least partially defines a dummy sidewall on the isolation structure; and forming a sidewall spacer overlying the isolation structure and lining the dummy sidewall, wherein the sidewall spacer has a triangular profile. In an embodiment, the method further includes forming a logic device structure on the logic region after forming the sidewall spacer. In an embodiment, the method further includes forming a memory cell structure on the memory region, wherein the memory cell structure is formed from the multilayer film before the etch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
 a substrate;
 a trench isolation structure sunken into a top of the substrate;
 a dummy structure overlying the trench isolation structure and wrapping around a top corner of the trench isolation structure from a top surface of the trench isolation structure to a sidewall of the trench isolation structure, wherein the dummy structure has a dummy sidewall that faces away from the top corner; and
 a sidewall spacer overlying the trench isolation structure and directly on the dummy sidewall, wherein a width of the sidewall spacer decreases from bottom to top.

2. The IC according to claim 1, wherein the dummy structure comprises a dummy gate electrode lining the sidewall of the trench isolation structure.

3. The IC according to claim 2, wherein the dummy structure comprises:
 an additional dummy gate electrode and a dummy gate dielectric layer stacked directly over the trench isolation structure and at least partially defining the dummy sidewall; and
 an additional sidewall spacer overlying the trench isolation structure, wherein the additional sidewall spacer is between and directly contacts the dummy gate electrode and the additional dummy gate electrode.

4. The IC according to claim 2, further comprising:
 a dummy gate dielectric layer underlying the dummy gate electrode, wherein the dummy gate electrode wraps around a top corner of the dummy gate dielectric layer from a top surface of the dummy gate dielectric layer to a sidewall of the dummy gate dielectric layer.

5. The IC according to claim 1, wherein the trench isolation structure has a recessed surface recessed below the top surface of the trench isolation structure, wherein the sidewall of the trench isolation structure extends from the recessed surface to the top surface, and wherein the dummy structure directly contacts the recessed surface.

6. The IC according to claim 1, wherein a cross-sectional profile of the sidewall spacer is right-trapezoid shaped.

7. The IC according to claim 1, wherein the width of the sidewall spacer is greater than zero at a topmost surface of the sidewall spacer.

8. An integrated circuit (IC) comprising:
a substrate;
a dielectric structure recessed into a top of the substrate;
a multilayer sidewall overlying the dielectric structure; and
a seal structure overlying the dielectric structure and sealing the multilayer sidewall from top to bottom, wherein the seal structure is a single material, wherein a height of the seal structure is substantially uniform from the multilayer sidewall to a midpoint between the multilayer sidewall and a bottom edge of the seal structure, and wherein the height decreases from the midpoint to the bottom edge.

9. The IC according to claim 8, further comprising:
an oxide-nitride-oxide (ONO) film; and
a polysilicon layer overlying the ONO film, wherein the ONO film and the polysilicon layer at least partially define the multilayer sidewall.

10. The IC according to claim 9, further comprising a nitride layer overlying the polysilicon layer and partially defining the multilayer sidewall.

11. The IC according to claim 8, wherein the multilayer sidewall is at a first angle relative to a bottom surface of the seal structure, wherein the seal structure has a boundary sidewall on an opposite side of the seal structure as the multilayer sidewall, wherein the boundary sidewall is at a second angle relative to the bottom surface, and wherein the second angle is less than the first angle.

12. The IC according to claim 8, wherein the seal structure is conductive.

13. The IC according to claim 8, wherein the seal structure and the dielectric structure define a common sidewall that is slanted on an opposite side of the seal structure as the multilayer sidewall.

14. An integrated circuit (IC) comprising:
a substrate;
an electrical isolation structure inset into a top of the substrate;
a first dummy structure directly over the electrical isolation structure and comprising a dummy sidewall;
a second dummy structure directly over the electrical isolation structure; and
a spacer structure directly over the electrical isolation structure, wherein the spacer structure is between the first and second dummy structures and directly contacts the dummy sidewall, and wherein the spacer structure at least partially defines a boundary sidewall that slants downward towards the second dummy structure.

15. The IC according to claim 14, wherein a bottom surface of the second dummy structure is recessed relative to a bottom surface of the spacer structure and a bottom surface of the first dummy structure.

16. The IC according to claim 15, wherein a top surface of the second dummy structure is level with a top surface of the spacer structure and a top surface of the first dummy structure.

17. The IC according to claim 14, wherein the electrical isolation structure partially defines the boundary sidewall, and wherein the boundary sidewall is smooth from top to bottom.

18. The IC according to claim 14, wherein the second dummy structure comprises a dummy gate electrode, a dummy gate dielectric layer underlying the dummy gate electrode, and an additional spacer structure, and wherein the additional spacer structure overlies the dummy gate dielectric layer directly on a sidewall of the dummy gate electrode.

19. The IC according to claim 14, wherein the first dummy structure comprises a dummy gate electrode and an additional spacer structure, wherein the additional spacer structure is on an opposite side of the dummy gate electrode as the spacer structure and is directly on a sidewall of the dummy gate electrode, and wherein a cross-sectional profile of the additional spacer structure has a different shape than that of the spacer structure.

20. The IC according to claim 14, wherein a height of the electrical isolation structure is greater directly under the first dummy structure and the spacer structure than directly under the second dummy structure.

* * * * *